US006959367B2

(12) United States Patent
Banno

(10) Patent No.: US 6,959,367 B2
(45) Date of Patent: Oct. 25, 2005

(54) SYSTEM HAVING READ-MODIFY-WRITE UNIT

(75) Inventor: Moriyasu Banno, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 479 days.

(21) Appl. No.: 10/325,935

(22) Filed: Dec. 23, 2002

(65) Prior Publication Data

US 2003/0120880 A1 Jun. 26, 2003

(30) Foreign Application Priority Data

Dec. 25, 2001 (JP) .............................. 2001-391671

(51) Int. Cl.$^7$ .......................... G06F 12/00; G06F 9/38
(52) U.S. Cl. ...................................... 711/155; 710/310
(58) Field of Search .............................. 365/220, 221; 710/6, 52, 305, 310; 711/155; 712/41, 219

(56) References Cited

U.S. PATENT DOCUMENTS

| 5,572,702 A | * | 11/1996 | Sarangdhar et al. ........ 711/146 |
| 5,666,515 A | | 9/1997 | White et al. |
| 6,226,017 B1 | | 5/2001 | Goossen et al. |
| 6,405,276 B1 | * | 6/2002 | Chen et al. .................. 710/310 |
| 6,745,302 B1 | * | 6/2004 | Taniguchi et al. .......... 711/155 |
| 6,795,901 B1 | * | 9/2004 | Florek et al. ................ 711/152 |

FOREIGN PATENT DOCUMENTS

| JP | 3-48370 | 3/1991 |
| JP | 5-81122 | 4/1993 |
| JP | 9-54694 | 2/1997 |
| JP | 2001-75826 | 3/2001 |

OTHER PUBLICATIONS

C. P. Freeman, IBM Technical Disclosure Bulletin, vol. 27, No. 8, XP-000714709, pp. 5019-5020, "Read-Modify-Write Data Integrity", Jan. 1985.

* cited by examiner

Primary Examiner—Christian P. Chace
(74) Attorney, Agent, or Firm—Oblon, Spivak, McClelland, Maier & Neustadt, P.C.

(57) ABSTRACT

A data processing system incorporates a central processing unit to decode and execute given instructions; a memory to store given data; a bus interface unit, provided between the central processing unit and the memory, to start a read bus cycle to read data from the memory, a write bus cycle to write data to the memory, or a dummy bus cycle different from the read and write bus cycles; and a read-modify-write unit provided between the central processing unit and the bus interface unit. The read-modify-write unit includes a modify-requirements buffer to store modify requirements having modify data output from the central processing unit and an operation control signal; and a modify operation circuit to apply an operation processing to read data output from the bus interface unit with the modify data output from the modify-requirements buffer under the operation control signal to output an operation result to the bus interface unit, as write data.

24 Claims, 25 Drawing Sheets

TABLE1: EXEMPLARY READ-MODIFY-WRITE INSTRUCTION, MODIFY REQUIREMENTS, BIT PATTERNS, AND TYPES OF OPERATION (FOR 8-BIT MEMORY)

| READ-MODIFY-WRITE INSTRUCTION | MODIFY REQUIREMENTS | | BIT PATTERN | TYPE OF OPERATION |
|---|---|---|---|---|
| | BIT LOCATION | INSTRUCTION | | |
| BIT SET | 0 | BIT SET | 0 0 0 0 0 0 0 1 | LOGICAL "OR" TO BIT PATTERN AND MEMORY DATA |
| | 1 | | 0 0 0 0 0 0 1 0 | |
| | 2 | | 0 0 0 0 0 1 0 0 | |
| | 3 | | 0 0 0 0 1 0 0 0 | |
| | 4 | | 0 0 0 1 0 0 0 0 | |
| | 5 | | 0 0 1 0 0 0 0 0 | |
| | 6 | | 0 1 0 0 0 0 0 0 | |
| | 7 | | 1 0 0 0 0 0 0 0 | |
| BIT CLEAR | 0 | BIT SET | 0 0 0 0 0 0 0 1 | LOGICAL "AND" TO INVERTED BIT PATTERN AND MEMORY DATA |
| | 1 | | 0 0 0 0 0 0 1 0 | |
| | : | | : | |
| | 7 | | 1 0 0 0 0 0 0 0 | |
| BIT INVERSION | 0 | BIT INVERSION | 0 0 0 0 0 0 0 1 | LOGICAL EXCLUSIVE "OR" TO BIT PATTERN AND MEMORY DATA |
| | 1 | | 0 0 0 0 0 0 1 0 | |
| | : | | : | |
| | 7 | | 1 0 0 0 0 0 0 0 | |

FIG.2

TABLE 2: EXEMPLARY READ-MODIFY-WRITE INSTRUCTION, MODIFY
REQUIREMENTS, BIT PATTERNS, AND TYPES OF OPERATION
(FOR 8-BIT MEMORY)

| READ-MODIFY-WRITE INSTRUCTION | MODIFY REQUIREMENTS | | BIT PATTERN | TYPE OF OPERATION |
|---|---|---|---|---|
| | BIT LOCATION | INSTRUCTION | | |
| BIT SET | 0 | BIT SET | 00000001 | LOGICAL "AND" TO BIT PATTERN AND MEMORY DATA |
| | 1 | | 00000010 | |
| | 2 | | 00000100 | |
| | 3 | | 00001000 | |
| | 4 | | 00010000 | |
| | 5 | | 00100000 | |
| | 6 | | 01000000 | |
| | 7 | | 10000000 | |

FIG. 3

PROCESSING OF RMWU 10

| F | D | E | W | | F | D | rd | mo | wr | | F | D | E | | F | D | E |
|---|---|---|---|---|---|---|----|----|----|---|---|---|---|---|---|---|---|
| INSTRUCTION 1 ||||| INSTRUCTION 2 ||||||| INSTRUCTION 3 ||| INSTRUCTION 4 |||
| 4 MACHINE CYCLES ||||| 5 MACHINE CYCLES ||||||| 4 MACHINE CYCLES ||| 3 MACHINE CYCLES |||

NOTE 1: INSTRUCTION 2 = READ-MODIFY-WRITE INSTRUCTION

NOTE 2: F = INSTRUCTION FETCH, D = INSTRUCTION DECODE, E = INSTRUCTION EXECUTION, rd = MEMORY READ, mo = MODIFY, wr = MEMORY WRITE, W = REGISTER WRITE

FIG. 26

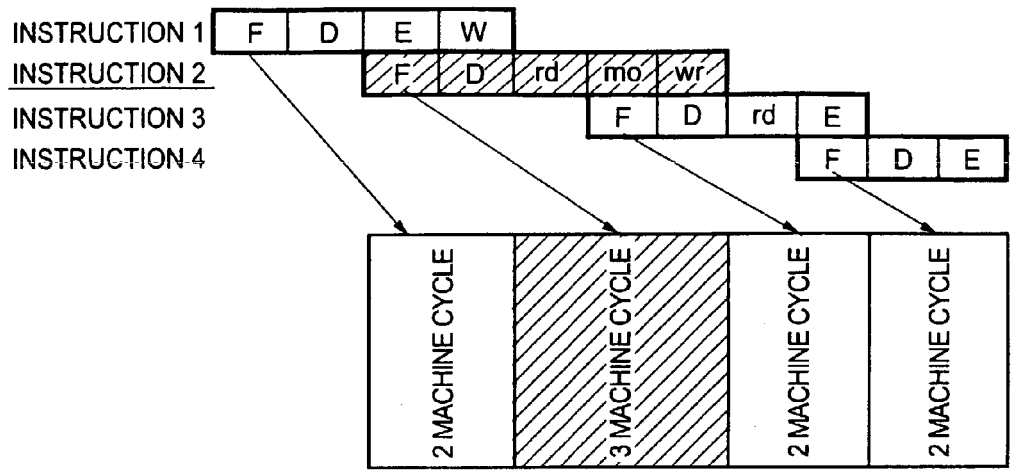

NOTE 1: INSTRUCTION 2 = READ-MODIFY-WRITE INSTRUCTION

NOTE 2: F = INSTRUCTION FETCH, D = INSTRUCTION DECODE, E = INSTRUCTION EXECUTION, rd = MEMORY READ, mo = MODIFY, wr = MEMORY WRITE, W = REGISTER WRITE

FIG. 27

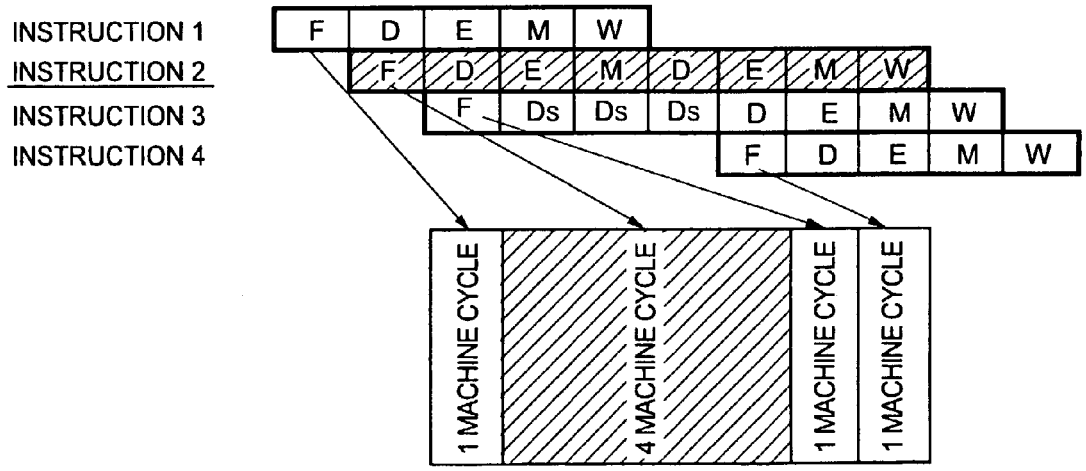

NOTE 1: INSTRUCTION 2 = READ-MODIFY-WRITE INSTRUCTION

NOTE 2: F = INSTRUCTION FETCH, D = INSTRUCTION DECODE, E = INSTRUCTION EXECUTION, M = MEMORY ACCESS, W = REGISTER WRITE, Ds = STALL (AT INSTRUCTION-DECODE STAGE)

FIG. 28

NOTE 1: INSTRUCTION 2 = READ-MODIFY-WRITE INSTRUCTION
NOTE 2: F = INSTRUCTION FETCH, D = INSTRUCTION DECODE, E = INSTRUCTION EXECUTION, M = MEMORY ACCESS, W = REGISTER WRITE, Ds = STALL (AT INSTRUCTION-DECODE STAGE), Es = STALL (AT COMPUTATION EXECUTE STAGE), Ms = STALL (AT MEMORY ACCESS STAGE)

US 6,959,367 B2

SYSTEM HAVING READ-MODIFY-WRITE UNIT

CROSS REFERENCE TO RELATED APPLICATION

This application is based upon and claims the benefit of priority from the prior Japanese Patent Application No. 2001-391671, filed on Dec. 25, 2001, the entire contents of which are incorporated herein by reference.

BACKGROUND OF THE INVENTION

The present invention relates to a system having a read-modify-write instructions installed therein.

Especially, this invention relates to a system having a read-modify-write unit for performing read-modify-write operations, in addition to a central processing unit (abbreviated into CPU hereinafter).

Moreover, the present invention relates to a system having a read-modify-write unit and also a digital signal processing (abbreviated into DSP hereinafter) unit, applicable, not only to CPU, but to a digital signal processor, etc., for performing a series of read-modify-write operations, like a CPU.

Microprocessors usually have a CPU incorporating an operation unit and a controller mounted on a silicon chip with LSI production technology. A computer system has such a microprocessor and memories connected thereto. Current microcomputers have memories also mounted on a microprocessor chip in which access is made between the microprocessor and memories via a bus interface unit (abbreviated into BIU hereinafter).

Shown in FIG. 30 is known microprocessor architecture with a CPU 1, a memory 2 and a BIU 3 interposed therebetween.

The CPU 1 executes a read bus cycle, a write bus cycle or a dummy bus cycle (not read nor write) to the memory 2 via the BIU 3. In detail, the BIU 3 receives a memory address, a read or a write request and write data, data to be written (in writing only) from the CPU 1, while passes read data, data read from the memory 2 to the CPU 1.

FIG. 30 illustrates direct access to the memory 2 by the BIU 3. Not only that, a memory controller (depending on the type of memory 2) may be provided between the BIU 3 and the memory 2, for read and write operations to the memory via the memory controller.

A read-modify-write instruction is explained in detail. This instruction is a single instruction for CPU to execute a series of operations to read data from a memory, modify some or all bits of the read data and then rewrite the original data with the modified data in the memory.

The read-modify-write instruction is used, for example, for bit manipulation to 1-bit data, such as, bit set, bit clear, bit inversion and bit logical operations (LOGICAL ORAND, NOR, etc) and also for bit field manipulation to 2-bit data or more, such as, arithmetic operations, logical operations, shift/rotation, insertion/replacement and clear/set.

Explained next is the bit manipulation and bit field manipulation to an 8-bit memory.

In the following explanation, the most-significant bit and the least-significant bit are defined as bit 7 and bit 0, respectively, for a binary-digit data "10101010" stored in the 8-bit memory at a given address.

The bit manipulation will be explained first for four cases.

Bit set to bit 2 replaces the value "0" of bit 2 in "10101010" with "1", thus "10101110" being written in the 8-bit memory.

Bit clear to bit 7 clears the value "1" of bit 7 from "10101010" to have the value "0" for bit 7, thus "00101010" being written in the 8-bit memory.

Bit inversion to bit 2 inverts the value "0" of bit 2 to "1" in "10101010", thus "10101110" being written in the 8-bit memory.

Bit-LOGICAL OR operation to bit 2 applies a logical OR between the value "1" and "0" of bit 2 in "10101010" to have the result "1", thus "10101110" being written in the 8-bit memory.

Next, the bit field manipulation is explained for seven cases.

Add operation to 3-bit data "010" of bits 6 to 4 in "10101010" with the value "110" gives the value "000" as the lower three bits of the results (sum), that is, "010+110=1000", thus "10001010" being written in the 8-bit memory.

Subtract (or decrement) operation to 3-bit data "010" of bits 6 to 4 in "10101010" from a value "1", that is, "010−1= 001" results in "10011010" which is written in the 8-bit memory.

An EOR operation, an exclusive logical OR, with the value "110" to 3-bit data "010" of bits 6 to 4 in "10101010" gives the value "100", thus "11001010" being written in the 8-bit memory.

Operational 1-bit right shift to 3-bit data "010" of bits 6 to 4 in "10101010" gives the value "001", thus "10011010" being written in the 8-bit memory.

1-bit right rotation to 4-bit data "0101" of bits 6 to 3 in "10101010" rotates the value "0101" to the value "1010", thus "11010010" being written in the 8-bit memory.

Bit field insertion of the value "1101" to 4-bit data "0101" of bits 6 to 3 in "101010101" replaces the value "1010" with "1101", thus "11101010" being written in the 8-bit memory.

Bit field clear to 4-bit data "0101" of bits 6 to 3 in "10101010" results in "10000010" which is written in the 8-bit memory.

Execution of data read from a memory, data modify to the read data and data rewrite of the modified data to the memory with different instructions while interrupted by another task between these instructions could cause interruption before data modify or data rewrite to data to be rewritten. Such interruption could cause adverse consequences to system operations, such as, data look-up before data rewrite.

To avoid such adverse consequences, a single read-modify-write instruction to execute read data, data modify and data write is required.

The adverse consequences discussed above are, for example, as follows:

Suppose that data for discriminating between a processing mode and a waiting mode are stored in a memory at certain addresses for two apparatus A and B, in which data "10" indicates that the apparatus A is in the processing mode, data "11" indicates that the apparatus B is in the processing mode and data "00" indicates that both of the apparatus A and B are in the waiting mode.

The discriminating data is then read from the memory for the apparatus A to execute a specific processing. The data is rewritten as "10" if it is "00" and restored, thus the apparatus A starts the processing. On the contrary, if the data is not "00", the apparatus A waits until the data changes to "00".

When the apparatus A completes the processing, the data "00" is written in the memory.

Like the apparatus A, the apparatus B waits until the data changes to "00". The data "11" is then written so that the apparatus B can start a specific processing. The data "00" is also written when the apparatus B completes the processing.

Read-modify-write processing is thus required for such a system in which the apparatus A and B are not allowed to simultaneously start processing so that processing will not be interrupt.

When the read-modify-write processing is broken in while data read from the memory by the apparatus A has been "00", interruption occurs during data-"10" writing for the apparatus A to start processing. The interruption forces the apparatus B to read the data from the memory, thus the data "00" is read and hence the data "11" is written for the apparatus B to start processing instead of the apparatus A.

When the interruption completes and the data "10" is written, the apparatus A starts processing even though the apparatus B is still in the processing mode.

As discussed above, the apparatus A and B could suffer consequences in processing to be switched between the apparatus due to the interruption.

The read-modify-write instruction includes bit manipulation, such as, bit set, bit clear, bit insertion, bit logical operations and bit inversion; bit field manipulation, such as, bit field insertion and bit field replacements; shift operations, such as, operation shift and logical shift; and add/subtract operations, such as, increment/decrement, as discussed above.

Installation of the read-modify-write instruction in microprocessors, microcomputers and DSPs, etc., requires processing time over one machine cycle for each of instruction fetch, instruction decode, memory read, data modify and memory write.

Illustrated in FIG. 26 is instruction execution in a first known CISC (Complex Instruction Set Computer) processor with no pipelined processing.

A read-modify-write instruction (INSTRUCTION 2 in FIG. 26) requires at least 5-machine-cycle instruction-execution time for instruction fetch "F", instruction decode "D", memory read "rd", data modify "mo", and memory write "wr".

Illustrated in FIG. 27 is instruction execution in a second known CISC processor with pipelined processing.

Some instructions in a read-modify-write instruction can be executed in parallel with other preceding and succeeding instructions although it requires 5-machine-cycle instruction-execution time for instruction fetch "F", instruction decode "D", memory read "rd", data modify "mo" and memory write "wr".

In detail, the F- and D-stages are executed while the preceding instructions "E" and "W" (INSTRUCTION 1) are being executed, and the mo- and wr-stages are executed while the succeeding instructions "F" and "D" (INSTRUCTION 3) are being executed. Therefore, the read-modify-write instruction is executed as if it runs for 3 machine cycles.

FIG. 28 illustrates instruction execution in a third known RISC (Reduced Instruction Set Computer) processor with 5-stage pipelined processing.

A pipeline has 5 stage of instruction fetch "F", instruction decode "D", computation execute "E", memory access "M" and register write "W".

Two types of processing are performed at the memory-access "M" stage; memory read at the initial M stage; and memory write at the next M stage. Modify processing is performed when the pipeline processing returns to the instruction-decode "D" and computation-execute "E" stages.

The pipeline processing is performed in the order of instruction fetch "F", instruction decode "D", computation execute "E", memory access "M" with memory read, instruction decode "D", computation execute "E" with data modify, memory access "M" with memory write and register write "W".

While the pipeline processing is being returned, an instruction following the read-modify-write instruction is stalled before the pipeline processing enters into an instruction-decode stage. The read-modify-write instruction illustrated in FIG. 28 thus seems to have 4 machine cycles. The third known process or consumes 2 stages for data modify in returning pipeline processing.

FIG. 29 illustrates read-modify-write processing for a fourth known processor that corresponds to the third known processor (FIG. 28) but to a memory with relatively slow read-write processing (such as a memory requiring 2 machine cycles for each of read and write).

The read-modify-write instruction illustrated in FIG. 29 requires 5 machine cycles because a memory-access "M" stage requires at least 2 machine cycles.

The slower the read-write processing for a memory used, the larger the number of machine cycles to be used for execution of the read-modify-write instruction, that is, machine cycles for the read-modify-write instruction=machine cycles for memory read+machine cycles for data modify+machine cycles for instruction execution.

As discussed above, the read-modify-write instructions in the known first to the fourth known processors are relatively slow instructions requiring at least 3 to 5 machine cycles.

The read-modify-write instruction requires longer execution time for slower processing-speed memories.

Read-modify-write instructions, such as bit manipulation, usually occupy 10% to 15% of programs installed in electrical household appliances, such as air conditioners and digital camcorders, and AV (Audio-Visual) equipment, such as CD players, DVD players, TVs and VCRs. Instructions of slow execution speed but often used will cause low processor performances.

A Read-modify-write-controlled system disclosed in Japanese Unexamined Patent publication No. 11-184761 has read-modify-write functions. The read-modify-write processing is performed simultaneously or in parallel to several memory banks. This is different from the present invention in which CPU instructions are executed in parallel with the preceding read-modify-write processing for higher throughput.

Recent program-implemented equipment have become complex in processing. Moreover, there are demands for higher processing speed and/or lower power consumption. Higher system performance, or smaller number of clocks per instruction (abbreviated into CPI hereinafter) for each CPU instruction is strongly desired.

Pipeline processing has been advanced for smaller CPI to meet the demands, however, obstructed by read-modify-write instructions such as bit manipulation due to 3 machine cycles or more in CPI.

Moreover, slow access-time memories affect CPI in read-modify-write operations. For, example, a 2 machine-cycle access-time memory requires 5 (=2+2+1) machine cycles in CPI for read-modify-write instructions.

As discussed above, the known processors have long apparent execution time for read-modify-write instructions.

Program-implemented equipment using many read-modify-write instructions thus have longer apparent execution time which give adverse affects to performances, particularly, of CPU-embedded system.

SUMMARY OF THE INVENTION

In order to overcome the problems discussed above, a purpose of the present invention is to provide a system with shorter apparent execution time for read-modify-write instructions.

Another purpose of the present invention is to provide a system capable of executing a read-modify-write instruction in one machine cycle like other instructions.

A data processing system according to the present invention includes: a central processing unit to decode and execute given instructions; a memory to store given data; a bus interface unit, provided between the central processing unit and the memory, to start a read bus cycle to read data from the memory, a write bus cycle to write data to the memory, or a dummy bus cycle (different from the read and write bus cycles); and a read-modify-write unit provided between the central processing unit and the bus interface unit. The read-modify-write unit has: a modify-requirements buffer to store modify requirements composed of modify data output from the central processing unit and an operation control signal; and a modify operation circuit to apply an operation processing to read data output from the bus interface unit with the modify data output from the modify-requirements buffer under the operation control signal to output an operation result to the bus interface unit, as write data.

BRIEF DESCRIPTION OF THE DRAWINGS

In the drawings:

FIG. 2 is a table illustrating read-modify-write instructions used in the first embodiment;

FIG. 3 is another table illustrating read-modify-write instructions used in the first embodiment;

FIG. 26 is an illustration showing a first known RMW processing in a CISC processor with no pipeline instruction execution;

FIG. 27 is an illustration showing a second known RMW processing in a CISC processor with pipeline instruction execution;

FIG. 28 is an illustration showing a third known RMW processing in a RISC processor with pipeline instruction execution;

DESCRIPTION OF THE PREFERRED EMBODIMENT

Embodiments of systems according to the present invention will be disclosed in detail with reference to the attached drawings.

Figure 1:
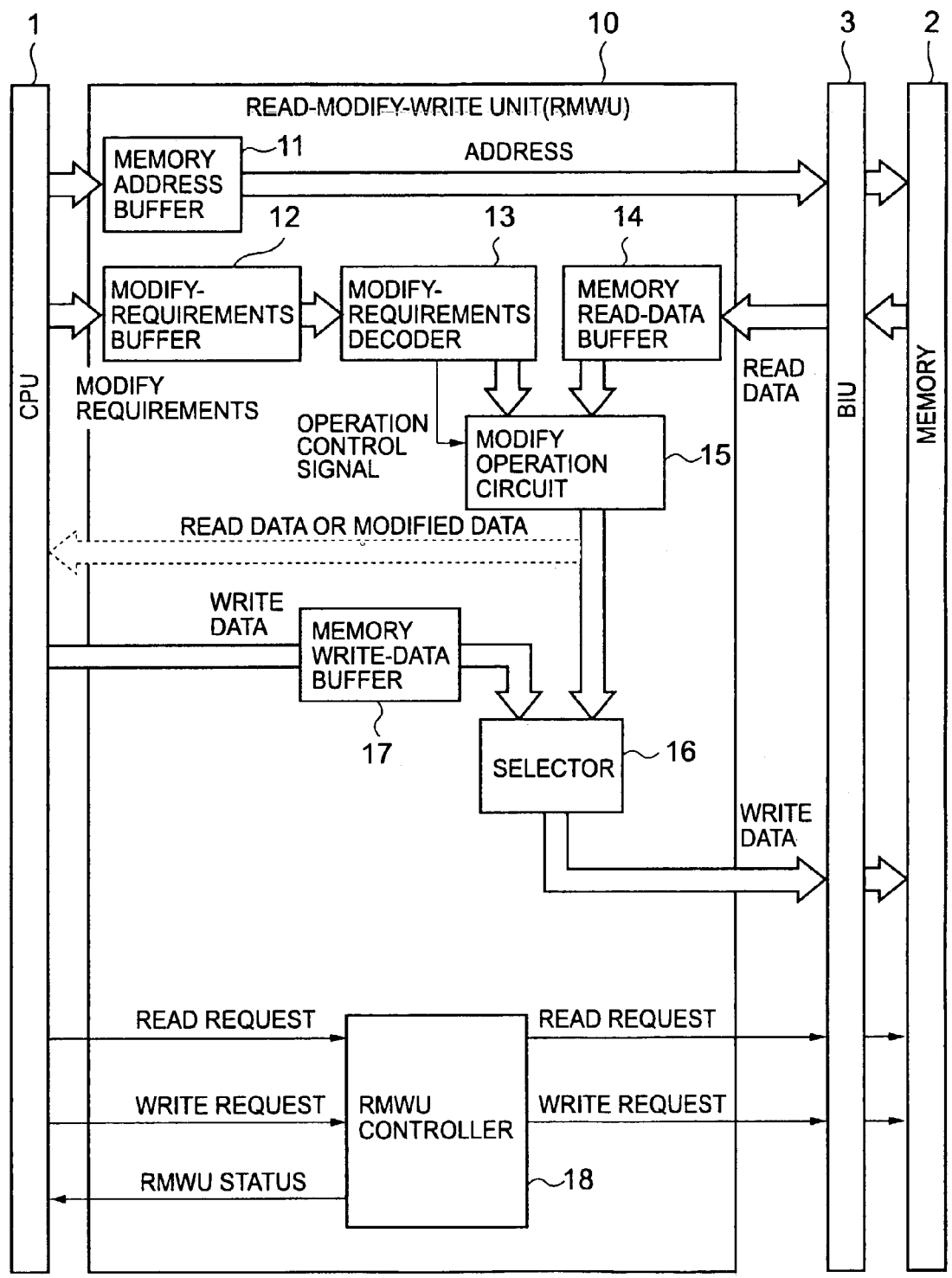
FIG. 1 is a system block diagram incorporating a read-modify-write unit according to a first embodiment of the present invention.

Disclosed first are a system architecture and its operational principle according to a first embodiment of the present invention with reference to FIGS. 1 to 3. The architecture of a processor according to a second embodiment, a modification to the first embodiment, will be disclosed next with reference to FIG. 4. Thereafter, the features of the present invention will be explained in accordance with several embodiments.

Disclosed now with respect to FIG. 1 is the system architecture according to the first embodiment of the present invention.

Figure 30:
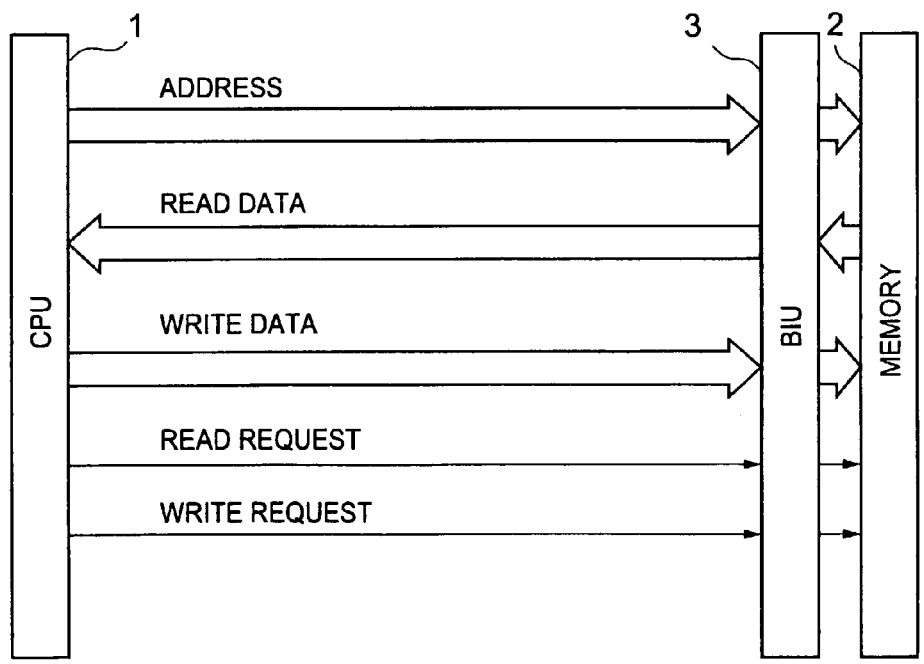
FIG. 30 is a block diagram of a known processor having read-modify-write instructions.

As shown in FIG. 1, the system according to the first embodiment at least includes a CPU 1 for decoding and executing several instructions; a memory 2 for storing given data; and a bus interface unit (abbreviated into BIU hereinafter) 3, interposed between the CPU 1 and the memory 2, for starting a read bus cycle to read data from the memory if an address from the CPU 1 is within address space of the memory 2, a write bus cycle to write data to the memory 2 if an address from the CPU 1 is within address space of the memory, or a dummy bus cycle different from the read and write bus cycles. The CPU 1, the memory 2 and the BIU 3 are analogous to those of the known system shown in FIG. 30.

A characteristic structure of the system in this embodiment is a read-modify-write unit (abbreviated into RMWU hereinafter) 10 for performing a memory-read processing, a data-modify processing and a memory-write processing under a read-modify-write (abbreviated into RMW occasionally) instruction.

The detailed architecture of the RMWU 10 will be disclosed with reference to FIG. 1.

The RMWU 10 is provided with a memory address buffer 11 for storing memory addresses supplied by the CPU 1 and outputting them to the BIU 3; a modify-requirements buffer 12 for storing modify requirements supplied by the CPU 1; a modify-requirements decoder 13 for decoding the modify requirements to generate modify data and an operation control signal; a memory read-data buffer 14 for storing read data (read from the memory 2) supplied by the BIU 3; a modify operation circuit 15 for applying an operation processing to the read data from the memory read-data buffer 14 with the modify data under the operation control signal to output the read data or modified data; a memory write-data buffer 17 for storing write data supplied by the CPU 1; a selector 16 for selecting either the write data from the write-data buffer 17 or the read data or the modified data from the modify operation circuit 15 and outputting the selected data to the BIU 3 as write data; and a RMWU controller 18 for receiving a read request, a write request or a read-modify-write request from the CPU 1 and outputting a control signal for requesting the read bus cycle, the write bus cycle or the dummy bus cycle to the BIU 3 so that a series of processing from read to write will not be interrupted when the read-modify-write request is sent from the CPU 1 and further outputting a busy-detection signal, to the CPU 1, indicating whether the RMWU 10 can accept another read request, write request or read-modify-write request from the CPU 1.

In FIG. 1 (like FIG. 4 herein under), the read-modify-write request is not shown as an input of the RMWU controller 18 because the modify requirements have the distinction of the write instruction and the read-modify-write instruction. Furthermore, if the CPU 1 causes only a read request to be active in the execution of a read instruction, only a write request to be active in the execution of a write instruction, and both the read request and the write request to be active in the execution of the read-modify-write instruction, it is unnecessary for the RMWU controller 18 to have the read-modify-write request as an input. Accordingly, in FIG. 1 (FIG. 4), the read-modify-write request is not shown as an input of the RMWU controller 18.

Disclosed next is the RMWU 10 for its operation.

Supplied to the RMWU 10 from the CPU 1 are a memory address, modify requirements, a read request, a write request, a read-modify-write request, write data, etc.

In response to the modify requirements and the read/write/read-modify-write requests, the RMWU 10 sends the read bus cycle, the write bus cycle or the dummy bus cycle instruction to the BIU 3 for read-modify-write, data write or data read at the memory address.

In detail, the RMWU 10 sends an instruction to the BIU 3 to start the read bus cycle in response to the read or the read-modify-write request. Read data is read from the memory 2, and it is supplied to the RMWU 10 via the BIU 3. The read data is sent to the CPU 1 directly or after modified at the modify operation circuit 15 of the RMWU 10, which depends on the type of a CPU instruction of which the CPU 1 requests to access the memory 2 via the RMWU 10.

For read-modify-write processing, the RMWU 10 instructs the BIU 3 to start the read bus cycle. Then, the BIU 3 starts the read bus cycle, reads data from the memory 2 and sends the read data to the RMWU 10.

The modify-requirements decoder 13 of the RMWU 10 generates modify data and an operation control signal in accordance with the modify requirements. The modify operation circuit 15 performs an operation according to the operation control signals between the read data and the modify data.

The operation result is sent to the BIU 13 via the selector 16. The RMWU 10 instructs the BIU 13 to start the bus write cycle. Thus, the RMWU 10 performs read-modify-write processing on behalf of the CPU 1.

Modify requirements consist of two pieces of information, such as, the location of a bit to be set and a bit set command, when the read-modify-write instruction is a bit set instruction.

Based on the location of a bit to be set, the modify-requirements decoder 13 of the RMWU 10 generates a bit pattern of "1" for the location of a bit to be set and "0" for the remaining bits. The decoder 13 further decodes the bit-set instruction to generate an operation control signal indicating a logical-OR operation.

The modify operation circuit 15 performs a logical OR between the read data from the BIU 3 and the bit pattern. The operation result is sent to the BIU 3 as write data via the selector 16. The RMWU 10 instructs the BIU 3 to start the write bus cycle for writing the write data to the memory 2. The memory address for the write data is usually the address used in a preceding memory read.

FIG. 2 shows a TABLE 1 that lists exemplary read-modify-write instructions, modify requirements, bit patterns, and types of arithmetic operation (in case of 8-bit memory).

The above exemplary modify requirements include the location of a bit. Instead of that, a bit pattern may directly be supplied to the RMWU 10, which however requires that the CPU 1 incorporates a bit-pattern generator.

There are processors in which bit manipulation instructions are logical operation instructions performing between a memory operand and an immediate operand. For such processors, modify requirements consist of the immediate operand and type of logical operation. A bit pattern for such processors is an immediate operand itself, hence no bit-pattern generators being required for the RMWU 10 or CPU 1.

For write processing, the RMWU 10 sends write data from the CPU 1 to the BIU 3 via the memory-write data buffer 17, and instructs the BIU 3 to start the write bus cycle. The BIU 3 then starts the write bus cycle to write the write data in the memory 2.

For read processing, the RMWU 10 instructs the BIU 3 to start the read bus cycle. The BIU 3 then starts the read bus cycle to read data from the memory 2. The read data is returned to the RMWU 10 and then to the CPU 1 with no modifications.

There are several ways of read-data return with no modifications, as follows:

(1) read data is returned to the CPU 1 not via the RMWU 10 but directly from the BIU 3;

(2) read data is returned to the CPU 1 not via the modify operation circuit 15 but via the memory-read data buffer 14; and (3) modify data and an operation control signal, which will give an operation result identical to read data, are generated at the modify-requirements decoder 13 and then the operation result is returned to the CPU 1 from the modify operation circuit 15.

The combination of modify data and operation control signal in option (3) may be of modify data of "0" at every bit and a logical-OR operation control signal or modify data of "1" at every bit and a logical-AND operation control signal. The system shown in FIG. 1 employs the option (3).

There are instructions preinstalled in the CPU 1, such as a bit test instruction, for modifying read data from the memory 2 and returning the modified data to the CPU 1 without writing the modified data in the memory 2.

In this case, the RMWU 10 instructs the BIU 3 to start the read bus cycle. The BIU 3 then starts the read bus cycle to read data from the memory 2 and return it to the RMWU 10 as read data.

The modify-requirements decoder 13 of the RMWU 10 generates modify data and an operation control signal from modify requirements. The modify operation circuit 15 applies an operation processing to the read data with the modify data under the operation control signal, the RMWU 10 returns the operation result to the CPU 1.

FIG. 3 also shows a TABLE 2 that lists exemplary read-modify-write instructions, modify requirements, bit patterns, and types of arithmetic operation (for 8-bit memory). An operation result obtained under TABLE 2 in FIG. 3 may be returned to the CPU 1 as it is. Or, it may be tested whether all bits of the operation result "0", and "0" is returned to the CPU 1 if the test shows positive whereas "1" returned if at least one bit is "1".

Figure 4:
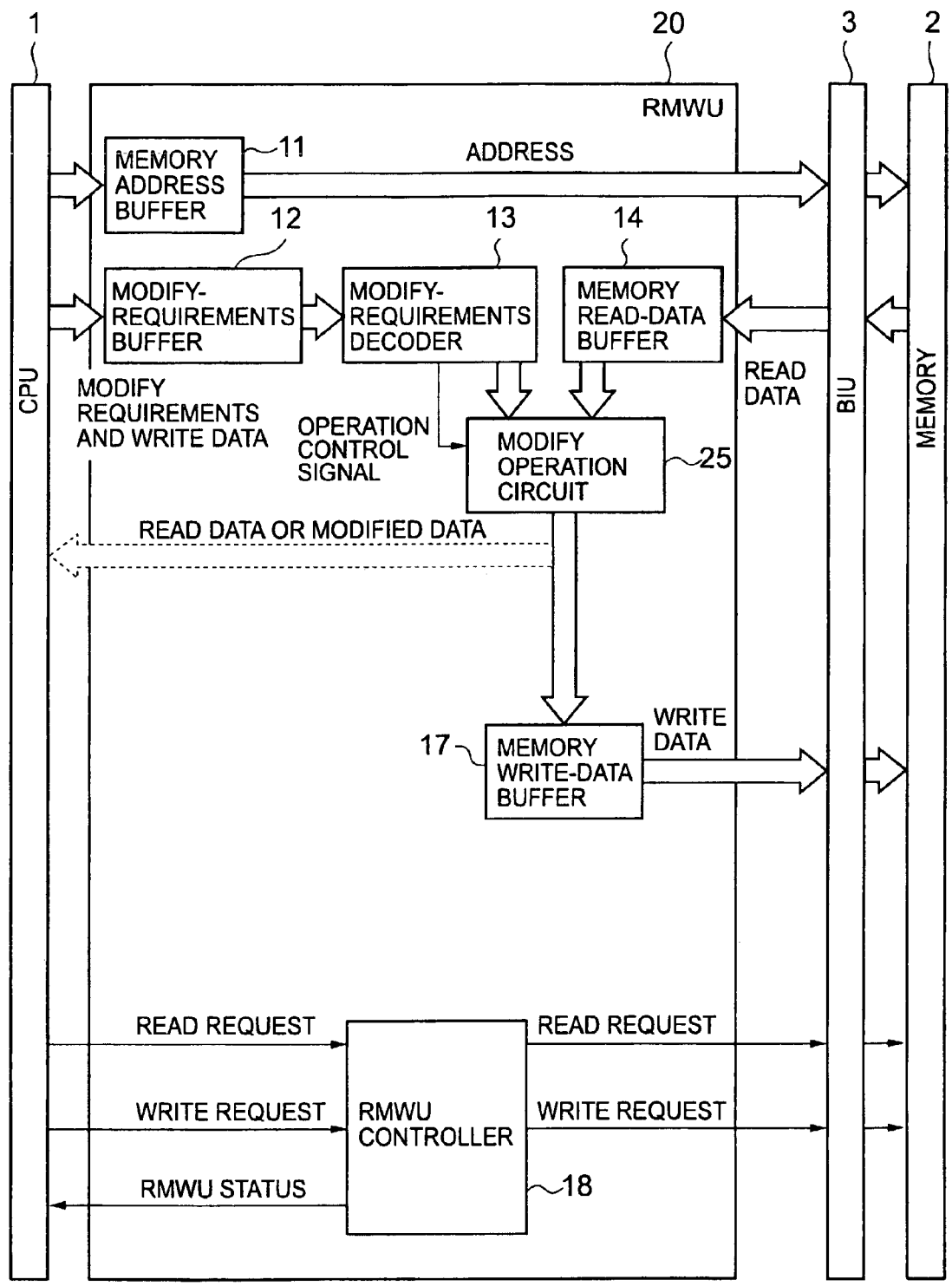
FIG. 4 is a system block diagram incorporating a read-modify-write unit according to a second embodiment of the present invention.

FIG. 4 shows a processor according to a second embodiment of the present invention, a modification to the first embodiment.

The feature of the second embodiment is that write data and a piece of information of modify requirements from a CPU 1 are transferred to a RMWU 20 through the same (common) signal lines.

This feature is appropriate for a situation in that the CPU 1 has not simultaneously issued a read-modify-write instruction and a write instruction, and hence the RMWU 20 does not require modify data and write data at the same time.

The modify data and the write data are sent from the CPU 1 to the RMWU 20 with using the common signal lines. Operation commands in modify requirements sending from the CPU 1 have a write command for the write instructions. If the operation command is the write command, a modify requirements buffer 12 of the RMWU 20 gets the data sending on the common signal lines as the write data; otherwise it gets the data as the modify data. In the case of the write command, the RMWU 20 does not instruct the BIU 3 to start the read bus cycle, an input (from a memory read data buffer 14) of the modify operation circuit 25 is neglected, the write data on the modify requirements buffer 12 is sent (1) directly to a memory write data buffer 17, or (2) via the modify operation circuit 25 without any modification, and then the write data on the memory write data buffer 17 is sent to the BIU 3.

The RMWU 20 is provided with a memory address buffer 11 for storing memory addresses supplied by the CPU 1 and outputting them to the BIU 3; a modify-requirements buffer 12 for storing modify requirements which consist of the operation command and the data (the modify data for read-modify-write instructions or the write data for write instructions) supplied by the CPU 1; a modify-requirements decoder 13 for decoding the modify requirements to generate modify data/write data and the operation control signal; a memory read-data buffer 14 for storing read data; a modify operation circuit 25 for performing between the read data from the buffer 14 and the modify data/write data from the decoder 13 under the operation control signals from the decoder 13 to output the read data, the write data or modified data; the memory write-data buffer 17 for storing the read data or modified data from the operation circuit 25 as write data or the write data from the circuit 25 or from directly the decoder 13 and then outputting the stored write data to the BIU 3; and a RMWU controller 18 for outputting a read request or a write request from the CPU 1 to the BIU 3 also a RMWU status signal to the CPU 1, indicating the status of the RMWU 20.

The processors in the first and second embodiments shown in FIGS. 1 and 4, respectively, both perform several specific operations according to the present invention, with different architectures.

The specific operations according to the present invention will be disclosed in detail in third to fifth embodiments in which the first or the second embodiment is employed in processor hardware.

Figure 5:
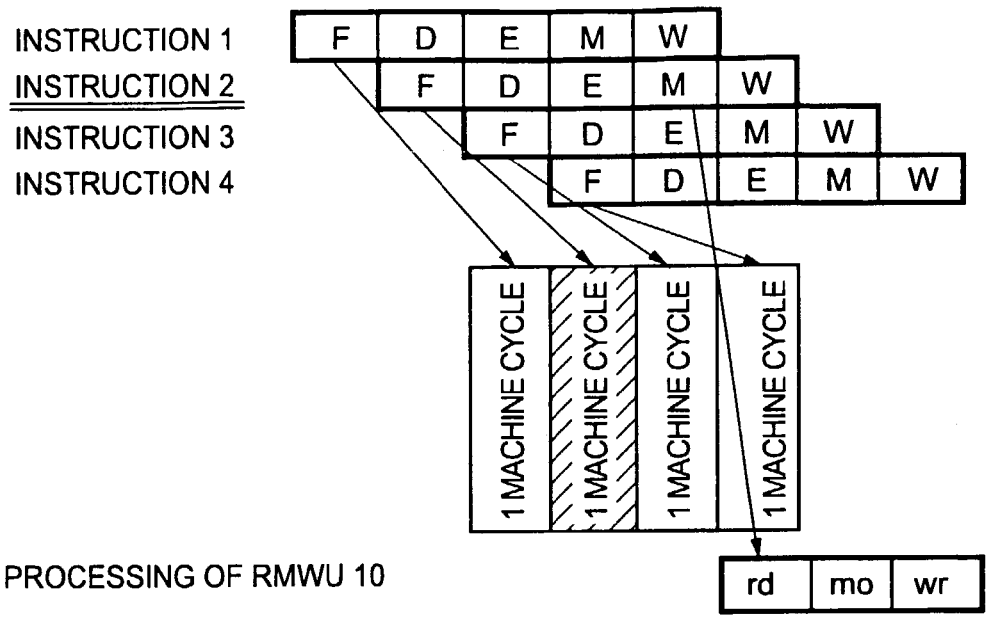
FIG. 5 is an illustration indicating exemplary execution of read-modify-write instructions in a processor according to a third embodiment of the present invention.

Disclosed first with reference to FIG. 5 is data processing with a processor in the third embodiment according to the present invention.

FIG. 5 illustrates pipeline processing of 5-stage CPU 1 instructions of instruction fetch "F", instruction decode "D", computation execute "E", memory access (or RMWU access) "M" and register write "W". Each stage requires one machine cycle. The processor in the third embodiment disclosed below is a RISC type. Or, it may be a CISC type.

In FIG. 5, INSTRUCTION 2 is a read-modify-write instruction. The memory access "M" includes memory read "rd", data modify "mo" and memory write "wr" when the RMWU 10 in the first embodiment is employed.

The read-modify-write instruction is executed by the CPU 1 under pipeline processing. When the processing reaches the memory-access "M" stage, the RMWU 10 receives a memory address and modify requirements from the CPU 1.

The CPU 1 completes the memory-access stage in one machine cycle and moves onto the next register-write stage while the instruction following the read-modify-write instruction appears at the memory-access stage.

During these CPU processing, the RMWU 10 sends a request of read bus cycle to the BIU 3. The request is held at the BIU 3 while the BIU 3 is using the bus for the preceding instruction. The read bus cycle starts when the bus is released from the preceding instruction. It can start immediately when the bus has been free.

The BIU 3 starts to read the memory 2 at the memory address received from the RMWU 10. The BIU 3 sends the data read from the memory 2 to the RMWU 10. The BIU 3 suspends another unit's bus-cycle request until the RMWU 10 completes to write the modified data into the memory 2.

The RMWU 10 modifies the read data under the modify requirements from the CPU 1 and instructs the BIU 3 to start a memory write bus cycle with the modified data as write data. Memory write is usually performed at the memory address already used in memory read. The BIU 3 writes the write data in the memory 2 and completes the read-modify-write operation.

The CPU 1 is executing instructions following the read-modify-write instruction in pipeline processing while the RMWU 10 and the BIU 3 are proceeding with the read-modify-write operation. The read-modify-write instruction is thus executed as if it runs for one machine cycle in this pipeline processing. The present invention therefore achieves high-performance read-modify-write operation.

Figure 6:
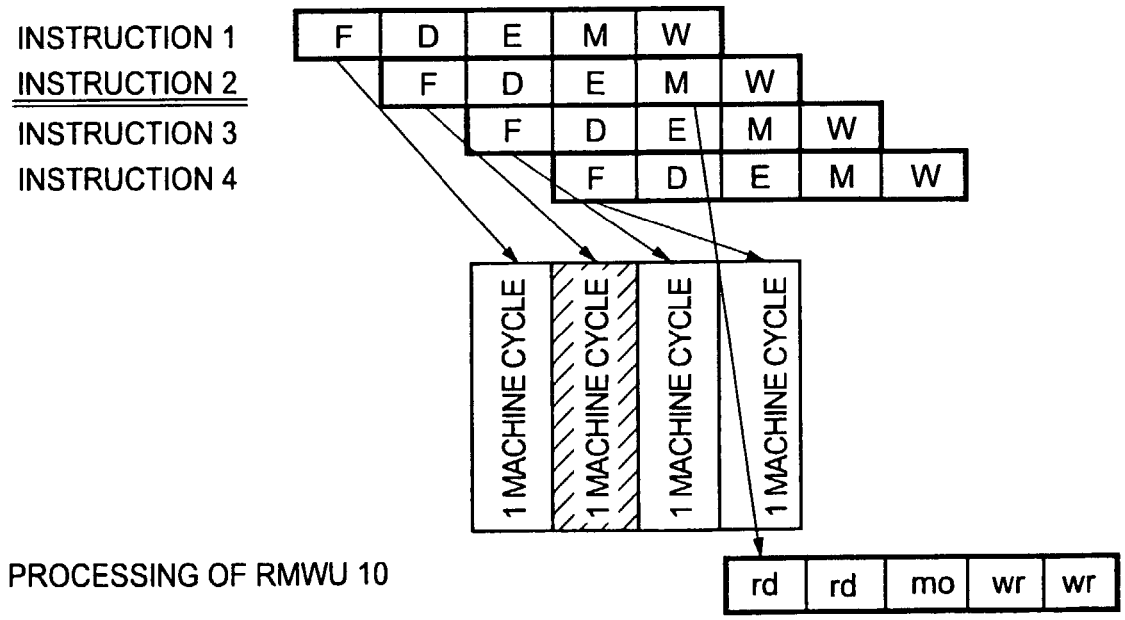
FIG. 6 is an illustration indicating exemplary execution of read-modify-write instructions in a processor according to a fourth embodiment of the present invention.

Disclosed next with reference to FIG. 6 is data processing with a processor in the fourth embodiment according to the present invention. Illustrated in FIG. 6 is execution of a read-modify-write instruction to a slow memory requiring access time of 2 machine cycles.

In FIG. 6, INSTRUCTION 2 is a read-modify-write instruction. The instructions are instruction fetch "F", instruction decode "D", computation execute "E", memory access (or RMWU access) "M" and register write "W". The memory access (M) includes memory read "rd", modify "mo" and memory write "wr" when the RMWU 10 in the first embodiment is employed, like shown in FIG. 5.

A read bus cycle and a write bus cycle to be instructed to the BIU 3 from the CPU 1 require two machine cycles each. Nevertheless, the CPU 1 executes the succeeding instructions one by one in pipeline processing while the RMWU 10 is executing the read or write bus cycle.

In other words, the CPU 1 executes the read-modify-write instruction in one machine cycle in pipeline processing to the memory 2 of a slow access time, according to the fourth embodiment. This high performance is very remarkable when compared to known processors with such a memory of a slow access time.

The RMWU 10 with a FIFO (First-In-First-out) that stores memory addresses and modify requirements from the CPU 1 enables successive execution of read-modify-write instructions (several different instructions may be interposed) without stalling pipeline processing. The CPU 1 receives FIFO-busy/ready information as RMWU 10 status and, if the FIFO is busy, the CPU 1 stalls the pipeline processing of the read-modify-write instructions until the FIFO becomes ready.

Not only the read and write bus cycle, the RMWU 10 may instruct a write bus cycle to the BIU 3 for executing memory write instructions such as a store instruction.

The present invention has enhanced a known write buffer unit (WBU) for only executing memory write instructions so that it can execute a sequence of memory read, modification and memory write, protect bus cycles from interruption and make adjustments between the sequence and instruction fetches and/or a memory-read bus cycle with the preceding memory-read instruction. These are also features of the present invention.

Also proposed in the present invention is a RMWU 10 capable of functions, such as a bit-test-and-set instruction, of modifying memory data (to set "1" at designated bits) while returning read data to the CPU 1.

On receiving read data from the BIU 3, the RMWU 10 may return the read data to the CPU 1 as it is or modify it for testing before return. For example, when a read data is "10110010" and a bit position for testing and setting is 6, "10110010" is returned as it is, in the case where RMWU 10 returns a read data to the CPU 1 as it is. On the other hand, in the case where the RMWU 10 modifies the data for testing, the RMWU 10 performs a logical AND between the read data and "0100000" (an immediate value at which only bit 6 is set to 1) to return "00000000" or "0" having a content of which a location of bit 6 is 0. The CPU 1 writes the data returned from the RMWU 10 in a designated register at a register write stage, to complete the bit-test and -set instruction.

The RMWU 10 or 20 in the present invention disclosed above is thus capable of executing a read-modify-write instruction in one machine cycle. The present invention therefore achieves high performance in processor-embedded equipment incorporating the RMWU 10 or 20.

Disclosed next with respect to FIGS. 7 to 10 are processors of fifth to seventh embodiments incorporating the RMWU 10 or 20, respectively, modifications to the third or the fourth embodiment.

Figure 7:
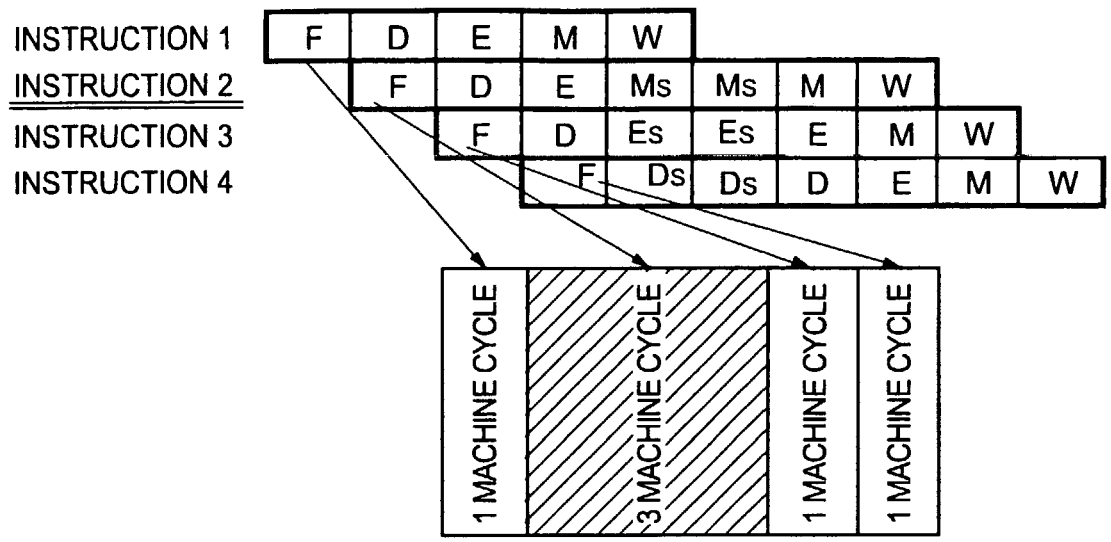
FIG. 7 is an illustration indicating exemplary execution of read-modify-write instructions to be enhanced in processors according to fifth and sixth embodiments of the present invention.

Illustrated in FIG. 7 are operations of the processors in both of the fifth and the sixth embodiments. The processors execute a read-modify-write instruction of three operations (read, modify and write) at a memory access stage in 3 machine cycles while instructions following this instruction have been stalled before the memory access stage.

The read-modify-write instruction in these embodiments requires 3 machine cycles for apparent execution time, thus almost no improvements in execution time in FIG. 7 compared to known processors.

Figure 8:
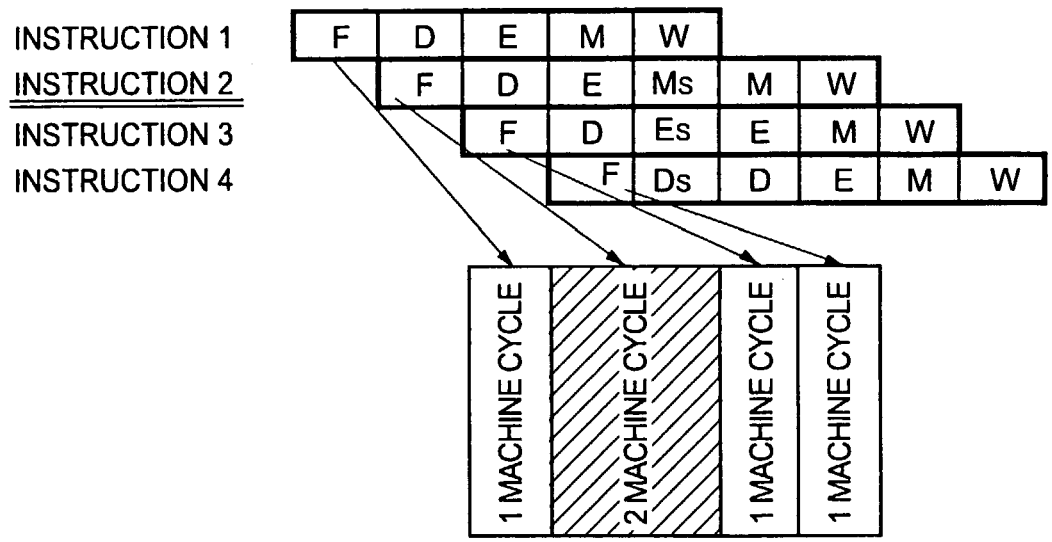
FIG. 8 is an illustration indicating exemplary execution of read-modify-write instructions enhanced in the processor according to the fifth embodiment of the present invention.
Figure 9:
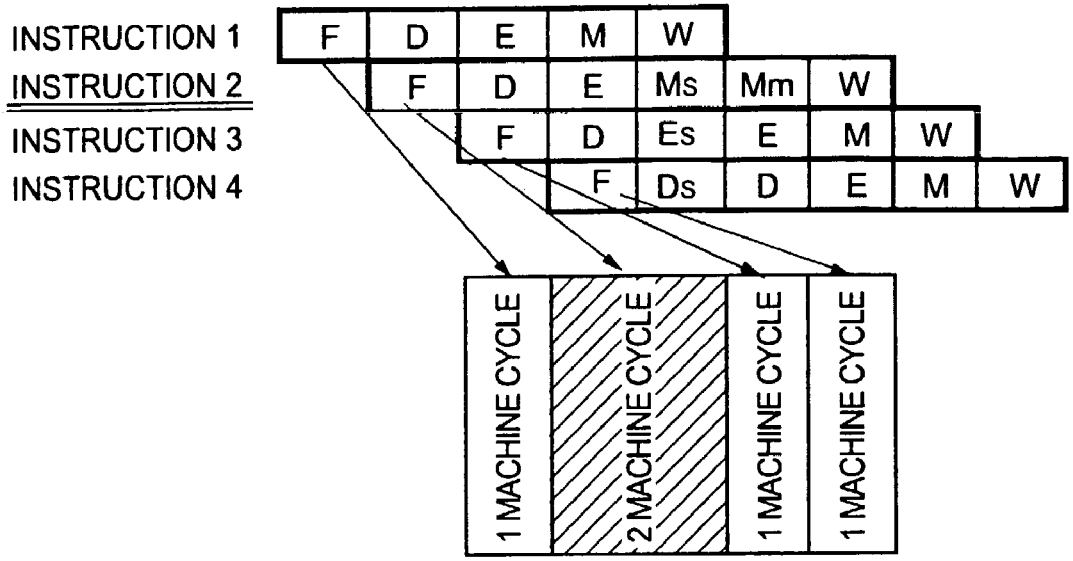
FIG. 9 is an illustration indicating exemplary execution of read-modify-write instructions enhanced in the processor according to the sixth embodiment of the present invention.

Nevertheless, the fifth and the sixth embodiments may not always necessary one machine cycle for a modify operation, as shown in FIGS. 8 and 9, respectively. This is because read-modify-write operations are performed at one memory access stage in these embodiments, with no pipeline-stage return, otherwise could require more than one machine cycle like the third known processor in FIG. 28.

In detail, modify is performed with memory read at an Ms stage in the fifth embodiment shown in FIG. 8 or it is performed with memory write at an M stage in the sixth embodiment shown in FIG. 9.

The fifth and the sixth embodiments therefore shorten the apparent execution time by 1 machine cycle from 3 to 2 machine cycles for INSTRUCTION 2.

The modify operation with memory read at the Ms stage in the processor of the fifth embodiment requires a modify-data generator (modify-requirements decoder 13) and a modify operation circuit (15 or 25) like the RMWU 10 or 20 in the first or the second embodiment, between the CPU 1 and the BIU 3.

Under a read-modify-write instruction, read data from the BIU3 is modified in accordance with a modify requirements from the CPU 1. Read data is, however, returned to the CPU 1 with no modifications under a simple read instruction (i.e. a load instruction).

In FIG. 8, INSTRUCTION 2 is the read-modify-write instruction with instruction fetch "F", instruction decode "D", computation execute "E", stall "Ms" (read and modify executed at memory-access stage), memory access "M" and register write "W". INSTRUCTIONS 3 and 4 have stall at instruction decode stage "Ds" and stall at execute stage "Es", respectively.

On the other hand, in the processor of the sixth embodiment as shown in FIG. 9, in case of the write operation, a modify-data generator (modify-requirements decoder 13) and a modify operation circuit (15 or 25) are provided between the CPU 1 and the BIU 3, as the same manner of the RMWU 10 or 20 in the first or the second embodiment. Under a read-modify-write instruction, write data from the CPU 1 is modified in accordance with modify requirements also from the CPU 1. Read data in a read bus cycle preceding a write bus cycle is returned to the CPU 1 without passing through the above modification circuitry in the sixth embodiment.

Illustrated in FIG. 9 is execution of instructions in the processor of the sixth embodiment. INSTRUCTION 2 is the read-modify-write-instruction with an instruction fetch "F", instruction decode "D", computation execute "E", stall at memory access stage "Ms" (read executed at memory-access stage), modify "Mm" and register write "W". INSTRUCTIONS 3 and 4 have stall at execute stage "Es" and stall at instruction decode stage "Ds", respectively.

In case of read-modify-write operation to a memory of slow access time, the read-modify-write instruction is continuously stalled at the memory access stage "M". Nevertheless, the sixth embodiment shortens machine cycle by one compared to the known processors, because of no modifications.

Moreover, the processor of the sixth embodiment with a non-blocking load for executing succeeding instructions (not accessible to memory at stage "M") with no stalls in read cycle masks a waiting time for the read-modify-write instruction in read bus cycle for a memory of slow access time. Thus, the sixth embodiment achieves execution of instructions almost one-half the known processors in execution time.

Figure 10:
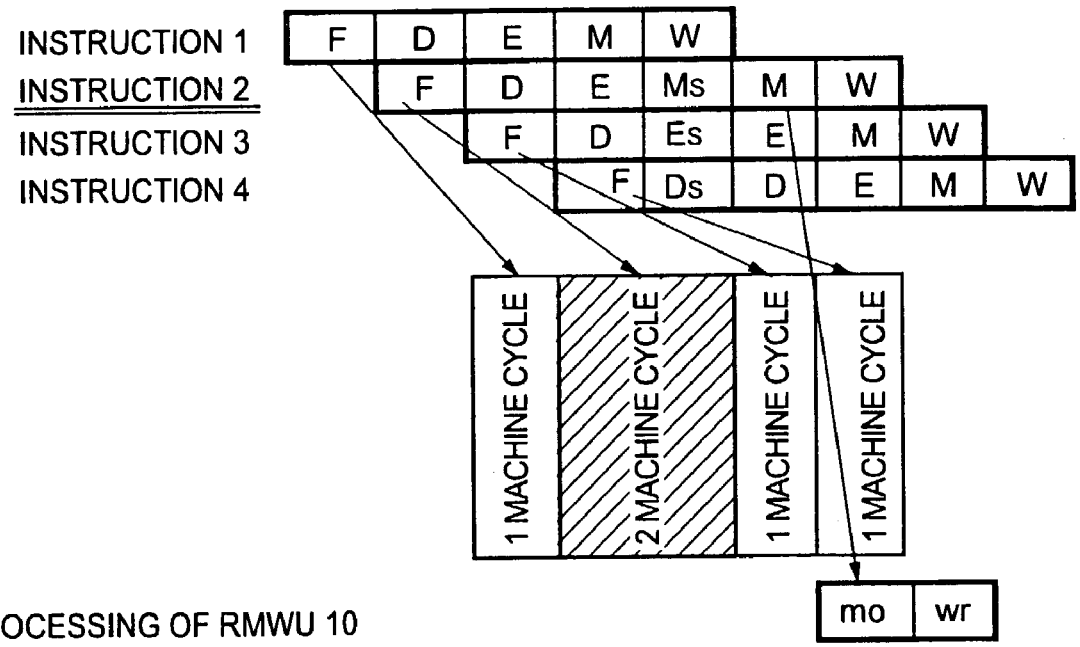
FIG. 10 is an illustration indicating exemplary execution of read-modify-write instructions in a processor according to a seventh embodiment of the present invention.

Illustrated in FIG. 10 is execution of instructions in the processor of the seventh embodiment.

Although not shown, the processor of the seventh embodiment is equipped with a modify write unit (abbreviated into MWU hereinafter) between the CPU 1 and the BIU 3. The MWU corresponds to the RMWU 10 or 20 in the first or the second embodiment, respectively, but having no reading functions.

The seventh embodiment performs reading from the memory and also writing to the MWU in two machine cycles at a memory-access stage, thus achieving higher processing speed than the known processors.

For memories of slow access time, the stage "M" of a read-modify-write instruction is stalled until read is completed. On the contrary, it is not stalled while memory addresses and modify requirements are written into the FIFO of MWU if the FIFO is not full. It is, however, stalled when the FIFO is full.

The seventh embodiment also achieves 2-machine-cycle instruction execution to memories of slow access time, with the non-blocking load described above to mask a waiting time caused by a read bus cycle.

As disclosed above, the first to the seventh embodiments achieve markedly high system performance with shortened execution time for read-modify-write instructions often used in embedded control system market.

Disclosed next with reference to FIGS. 11 to 25 are eighth to twenty-first embodiments, respectively, according to the present invention, based on the foregoing embodiments.

Elements shown in FIGS. 11 to 25 that are the same as or analogous to the elements shown in FIGS. 1 to 10 are referenced by the same reference numerals.

Figure 11:
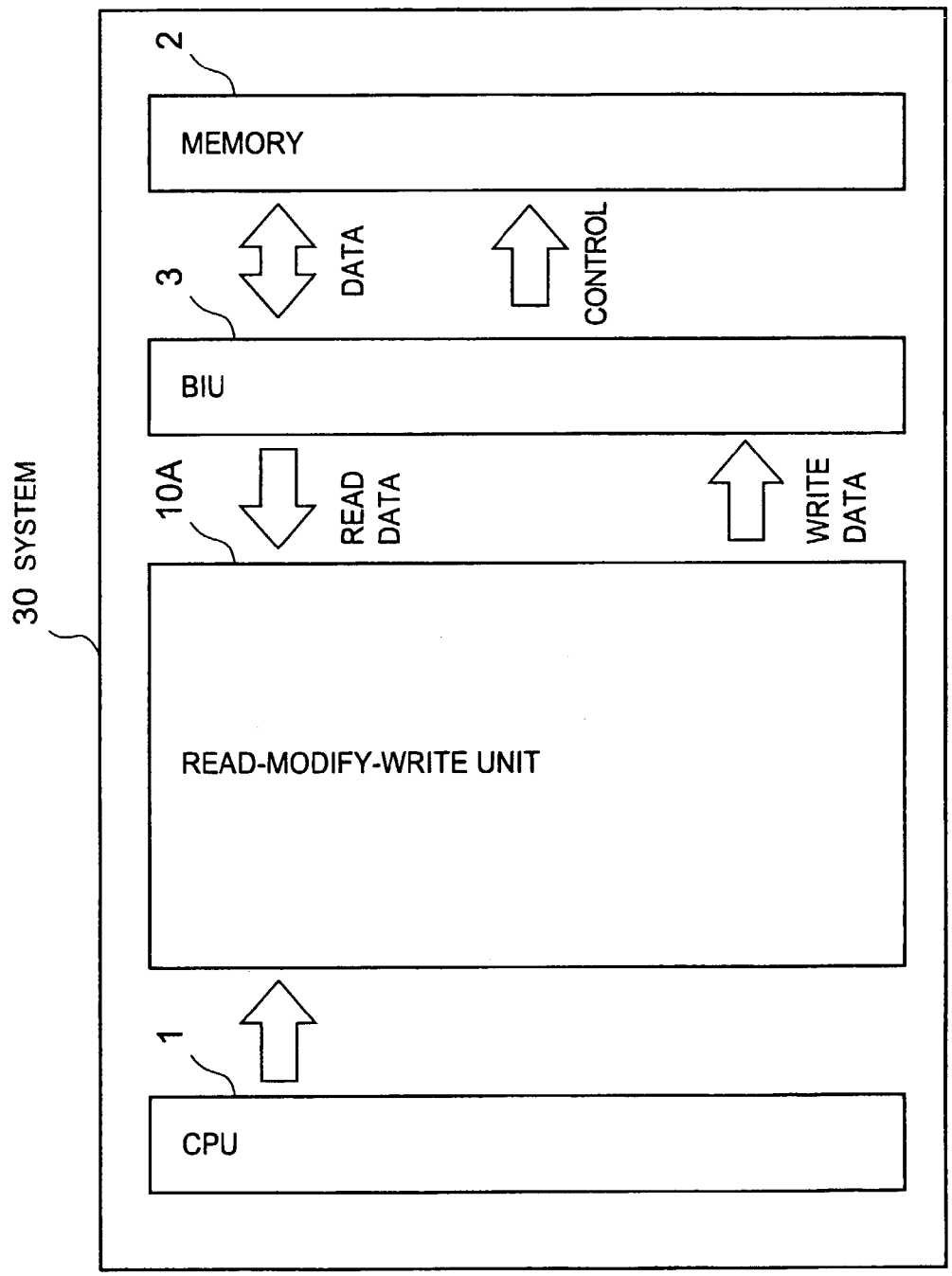
FIG. 11 is a system block diagram incorporating a read-modify-write unit shared by eighth to twenty-first embodiments of the present invention.
Figure 12:
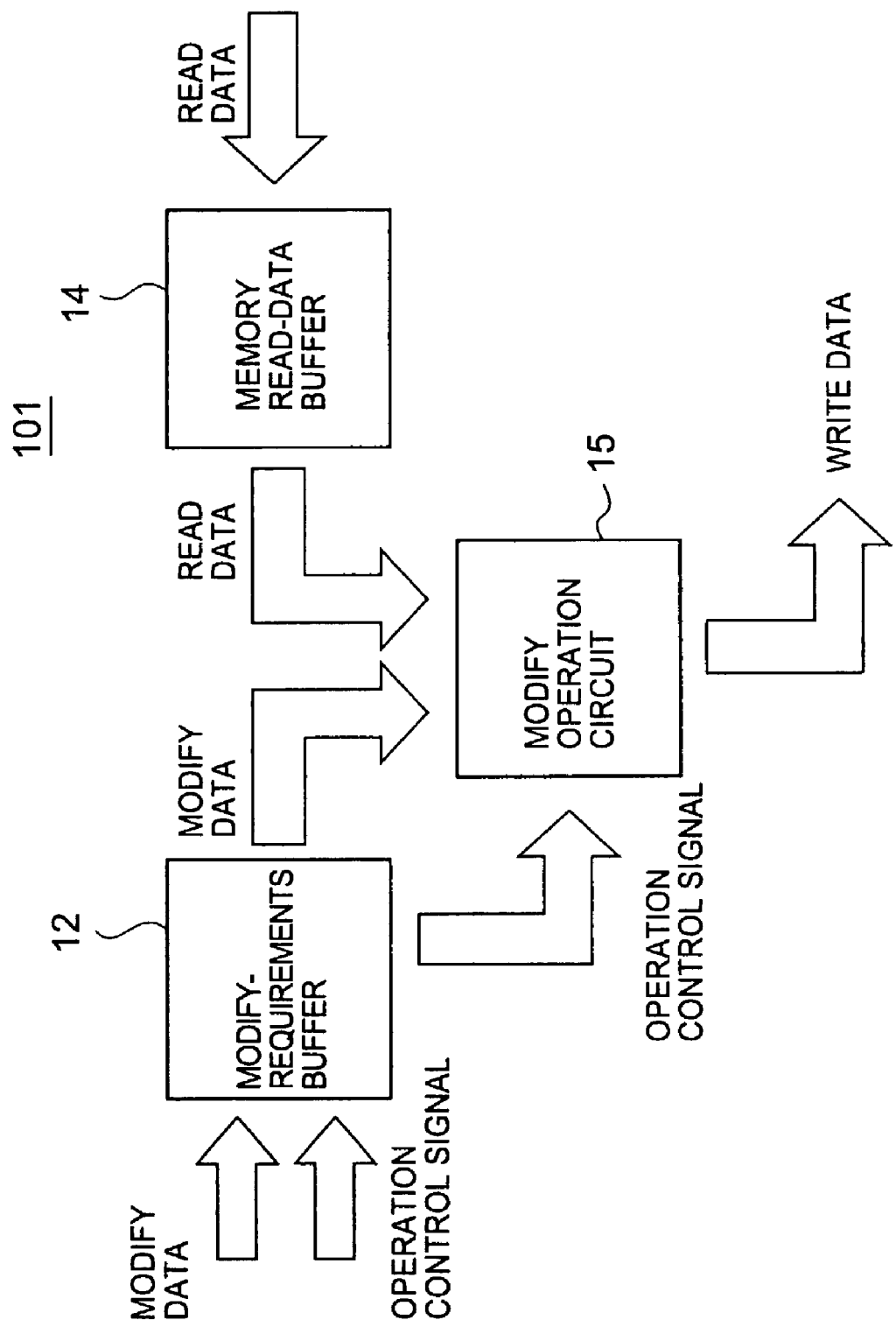
FIG. 12 is a system block diagram incorporating a read-modify-write unit according to the eighth embodiment of the present invention.

(1) As shown in FIGS. 11 and 12, a system 30 having a read-modify-write unit 10A (101) according to the eighth embodiment of the present invention incorporates a CPU 1 for decoding and executing several instructions; a memory 2 for storing given data; and a BIU 3, interposed between the CPU 1 and the memory 2, for starting a read bus cycle, a write bus cycle or a dummy bus cycle different from the read and write bus cycles, to read data from or write data to the memory 2.

The system 30 is further provided, between the CPU 1 and the BIU 3, with a modify-requirements buffer 12 for storing modify requirements supplied by the CPU 1; a memory read-data buffer 14 for storing read data output from the BIU 3; a modify operation circuit 15 for applying an operation processing to the read data from the buffer 14 with the modify data from the buffer 12 under an operation control signal also from the buffer 12 to output the resultant modified data to the BIU 3, as write data.

Figure 13:
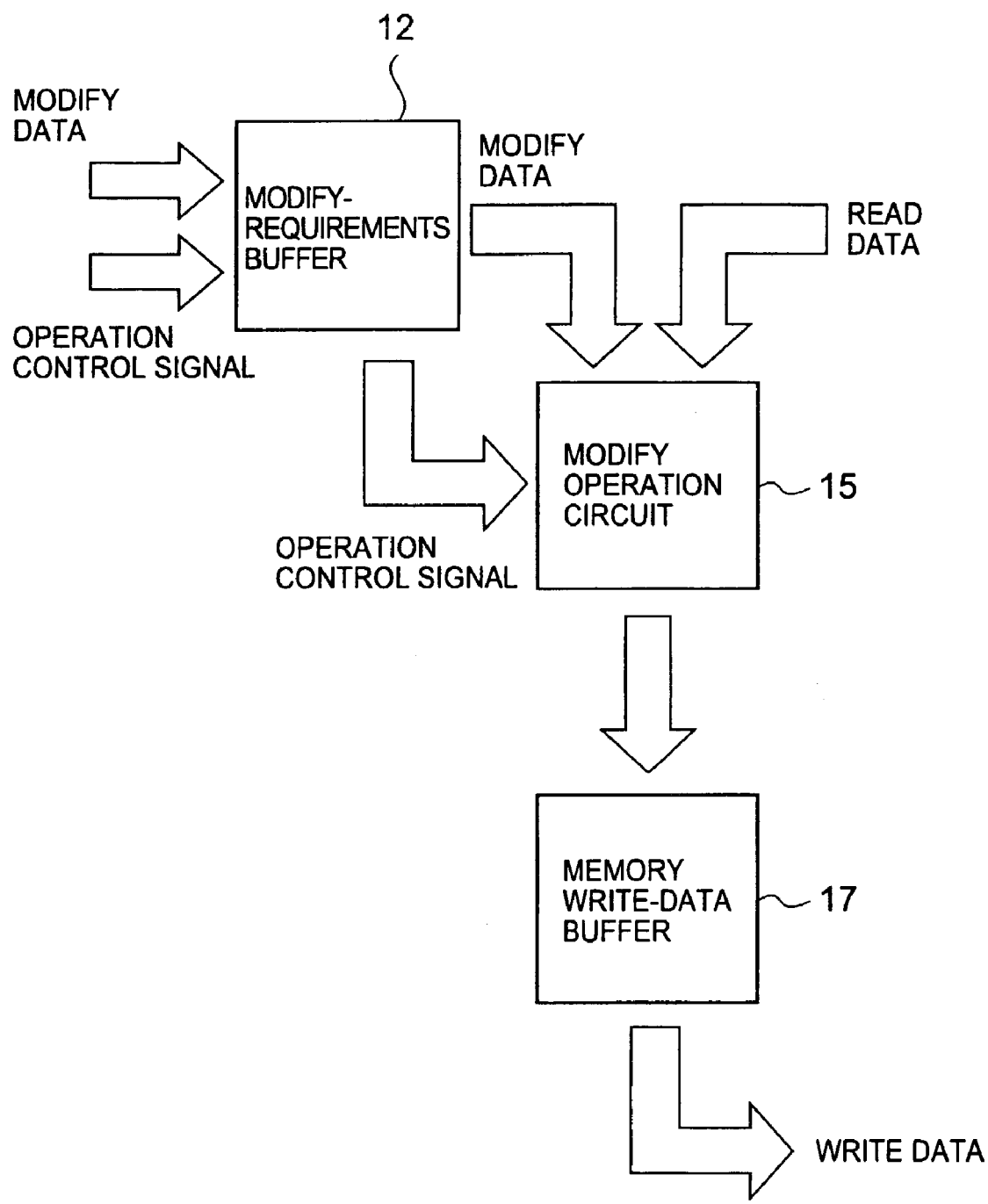
FIG. 13 is a system block diagram incorporating a read-modify-write unit according to the ninth embodiment of the present invention.

(2) As shown in FIGS. 11 and 13, a system 30 having a read-modify-write unit 10A (102) according to the ninth embodiment of the present invention incorporates a CPU 1 for decoding and executing several instructions; a memory 2 for storing given data; and a BIU 3, interposed between the CPU 1 and the memory 2, for starting a read bus cycle, a write bus cycle or a dummy bus cycle different from the read and write bus cycles, to read data from or write data to the memory 2.

The system 30 is further provided, between the CPU 1 and the BIU 3, with a modify-requirements buffer 12 for storing modify requirements supplied by the CPU 1; a modify operation circuit 15 for applying an operation processing to the read data output from the BIU 3 with the modify data from the buffer 12 under an operation control signal from the buffer 12; and a memory write-data buffer 17 for storing modified data from the operation circuit 15, as write data, and outputting the data to the BIU 3.

Figure 14:
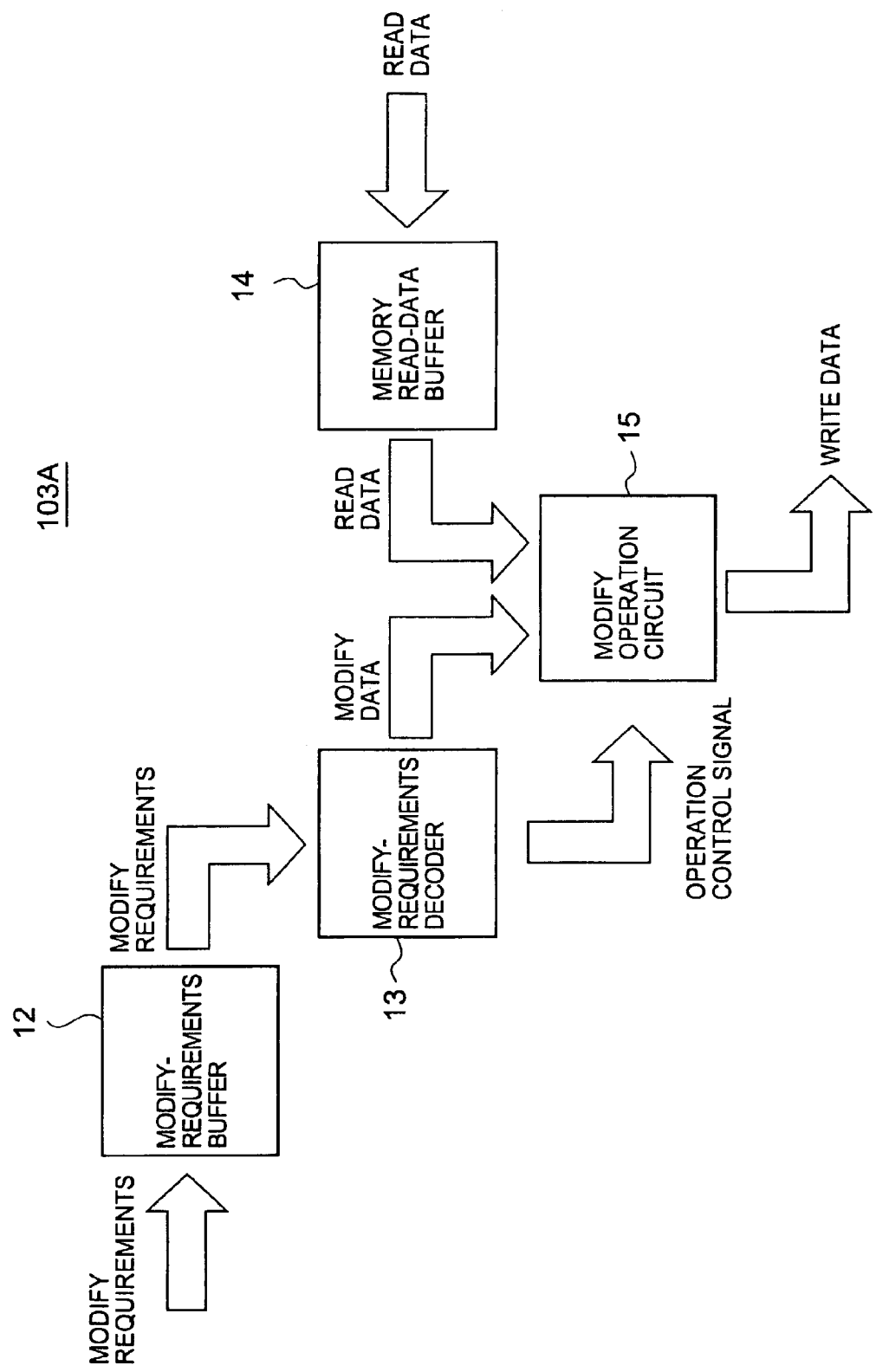
FIG. 14 is a system block diagram incorporating a read-modify-write unit according to the tenth embodiment of the present invention.
Figure 15:
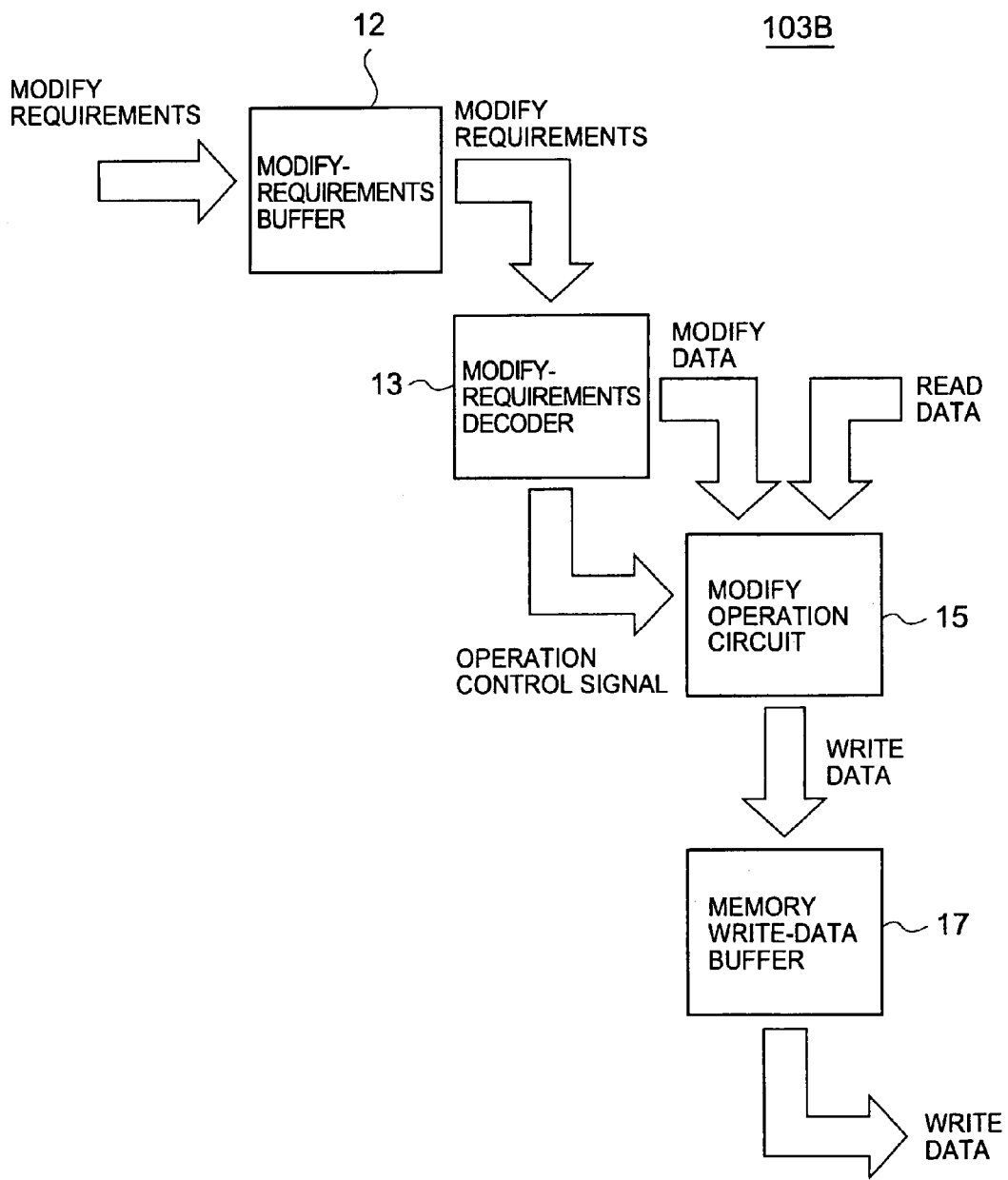
FIG. 15 is a system block diagram incorporating a read-modify-write unit according to a first architecture in the eleventh embodiment of the present invention.

(3) As shown in FIG. 11 and also FIG. 14 or 15, a system 30 having a read-modify-write unit 103A or 103B based on the system (1) or (2), according to the tenth or eleventh embodiment of the present invention may have a modify-requirements decoder 13 between a modify-requirements buffer 12 for storing modify requirements output from the CPU 1 (in which the modify requirements are obtained by encoding the modify data and the operation control signal) and the modify operation circuit 15. The modify requirements decoder 13 decodes the modify requirements into modify data and an operation control signal.

Figure 16:
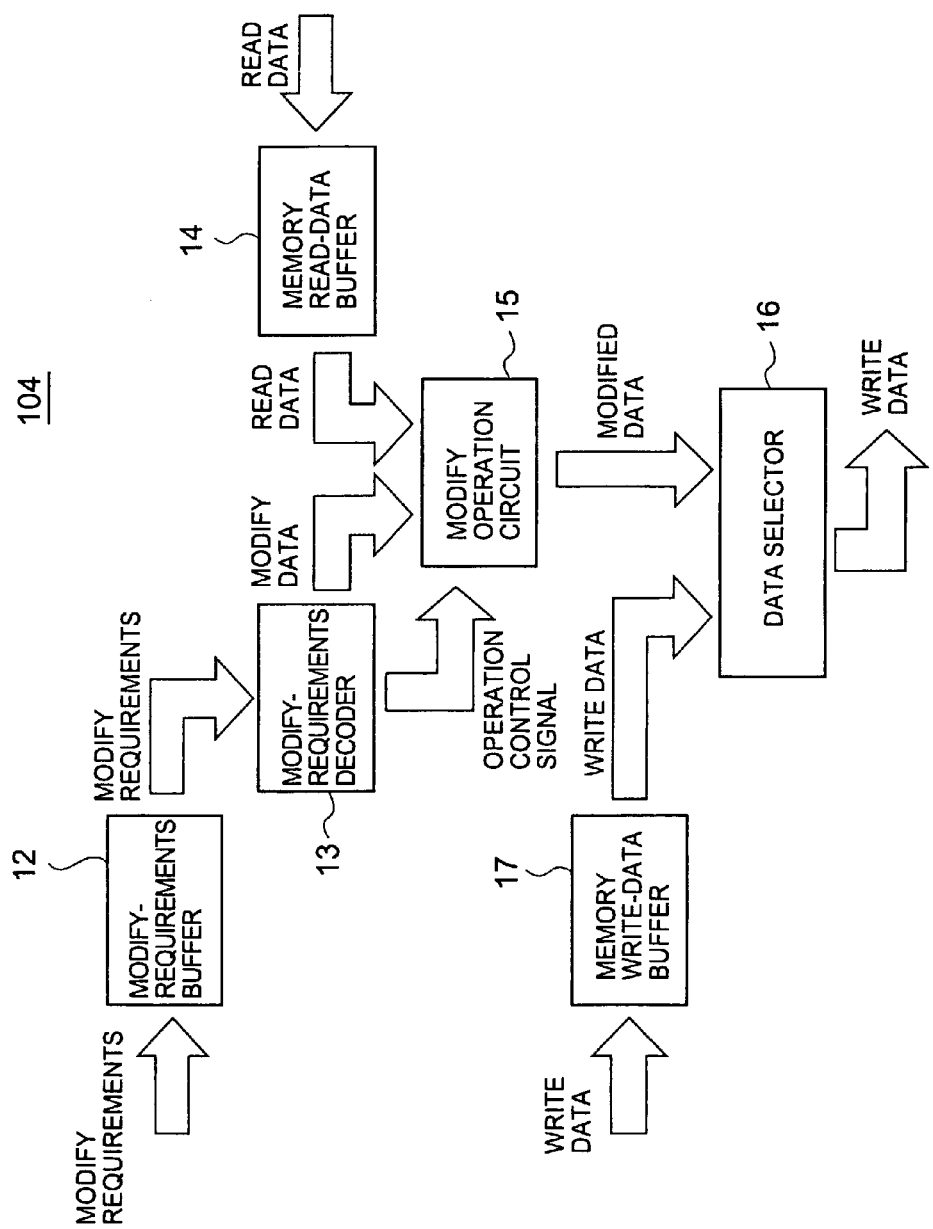
FIG. 16 is a system block diagram incorporating a read-modify-write unit according to a second architecture in the twelfth embodiment of the present invention.

(4) As shown in FIGS. 11 and 16, a system according to the twelfth embodiment of the present invention, based on the system (1) or (3), may have a memory write-data buffer 12 for storing write data from the CPU 1 and a data selector 16 for selecting either the write data from the buffer 12 or the modified data from the modify operation circuit 15.

Figure 17:
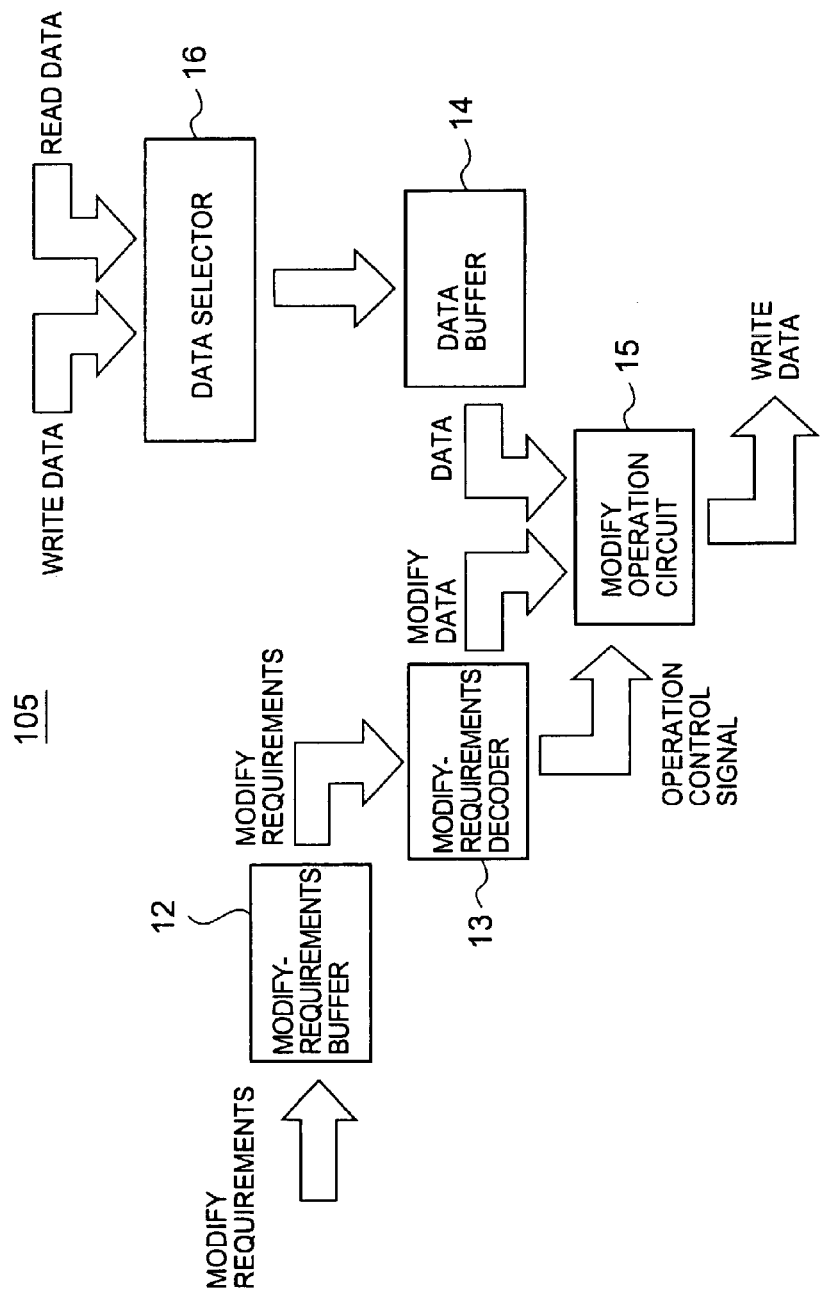
FIG. 17 is a system block diagram incorporating a read-modify-write unit according to the thirteenth embodiment of the present invention.

(5) As shown in FIGS. 11 and 17, a system according to the thirteenth embodiment of the present invention, based on the system (1) or (3), may have, instead of the memory read-data buffer 14, a data selector 16 for selecting either the write data from the CPU 1 or the read data read from the memory 2 via the BIU 3 and a data buffer 14 for storing the selected data from the selector 16 and supplying the stored data in the data buffer 14 to the modify operation circuit 15.

Figure 18:
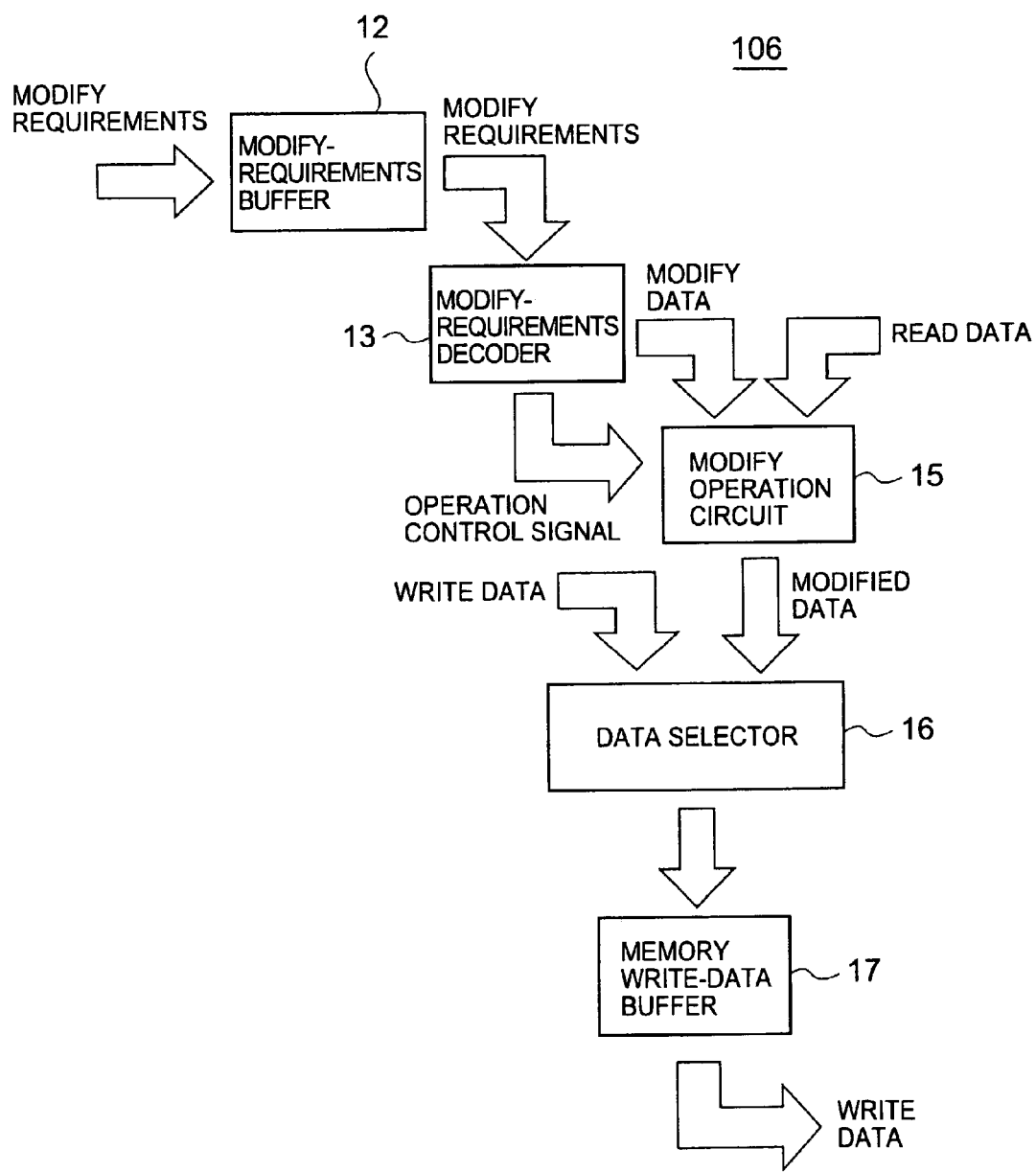
FIG. 18 is a system block diagram incorporating a read-modify-write unit according to the fourteenth embodiment of the present invention.
Figure 19:
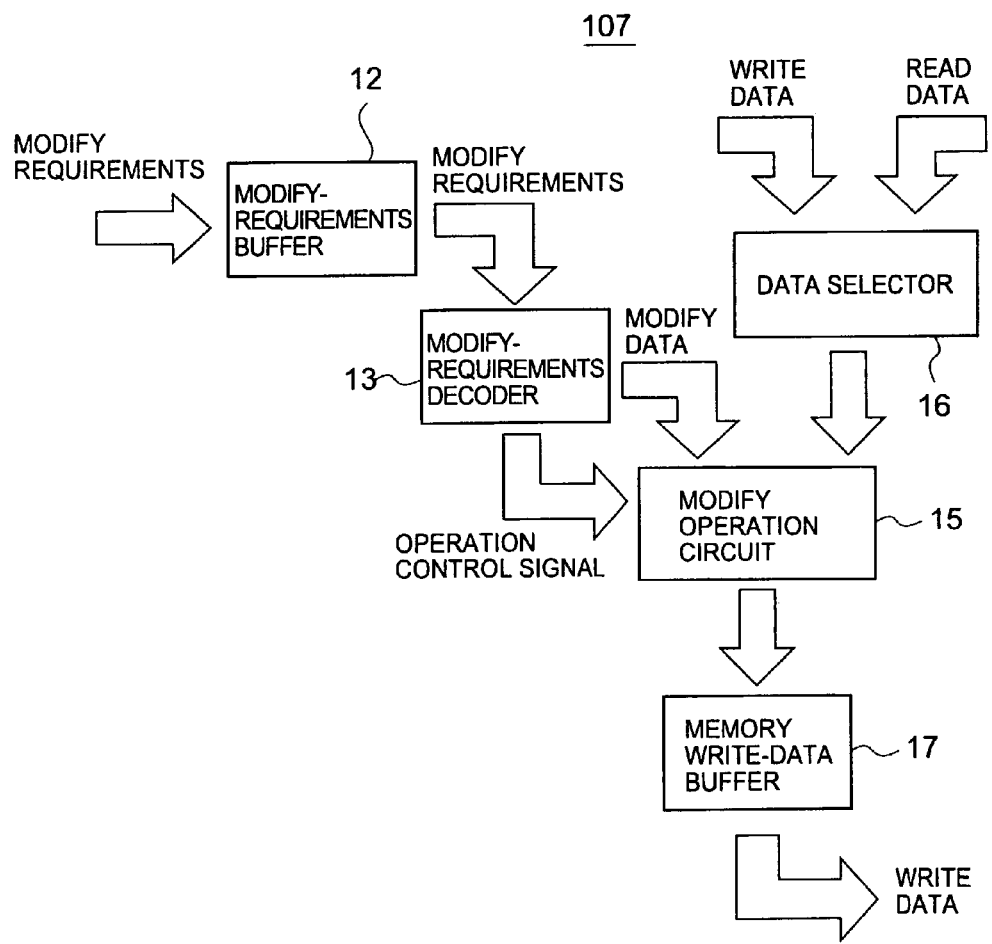
FIG. 19 is a system block diagram incorporating a read-modify-write unit according to the fifteenth embodiment of the present invention.

(6) As shown in FIGS. 11 and 18, a system according to the fourteenth embodiment of the present invention, based on the system (2) or (3), may have a data selector 16 for selecting either the write data from the CPU 1 or the modified data from the modify operation circuit 15 and outputting the selected data to the memory write-data buffer 17.

(7) As shown in any combination of FIGS. 11 and 13, FIGS. 11 and 14, FIGS. 11 and 15, or FIGS. 11 and 19, a system according to the fifteenth embodiment of the present invention, based on the system (2) or (3), may have a data selector 16 for selecting either the write data from the CPU 1 or the read data read from the memory 2 via the BIU 3 and outputting the selected data to the modify operation circuit 15.

Figure 20:
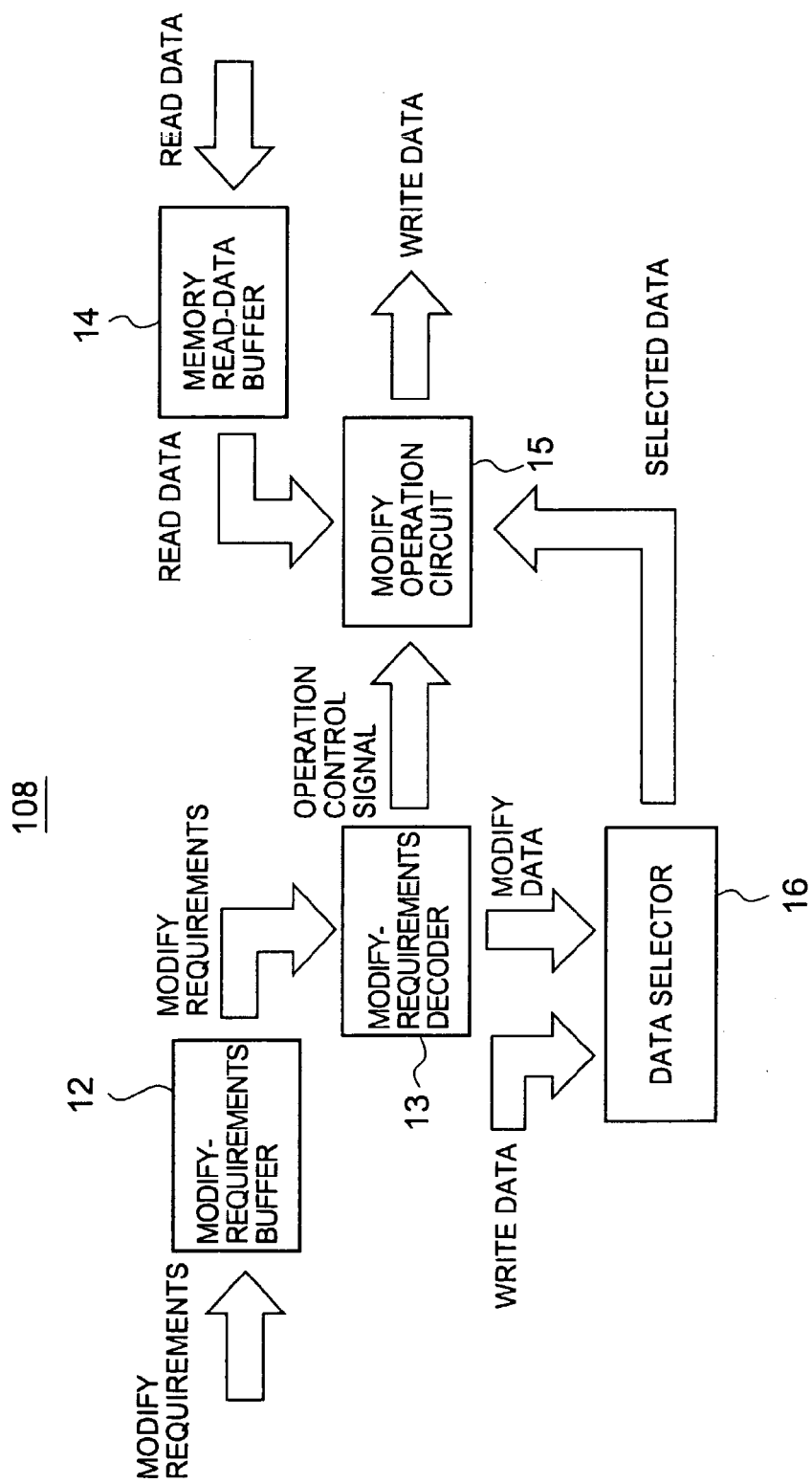
FIG. 20 is a system block diagram incorporating a read-modify-write unit according to the sixteenth embodiment of the present invention.
Figure 21:
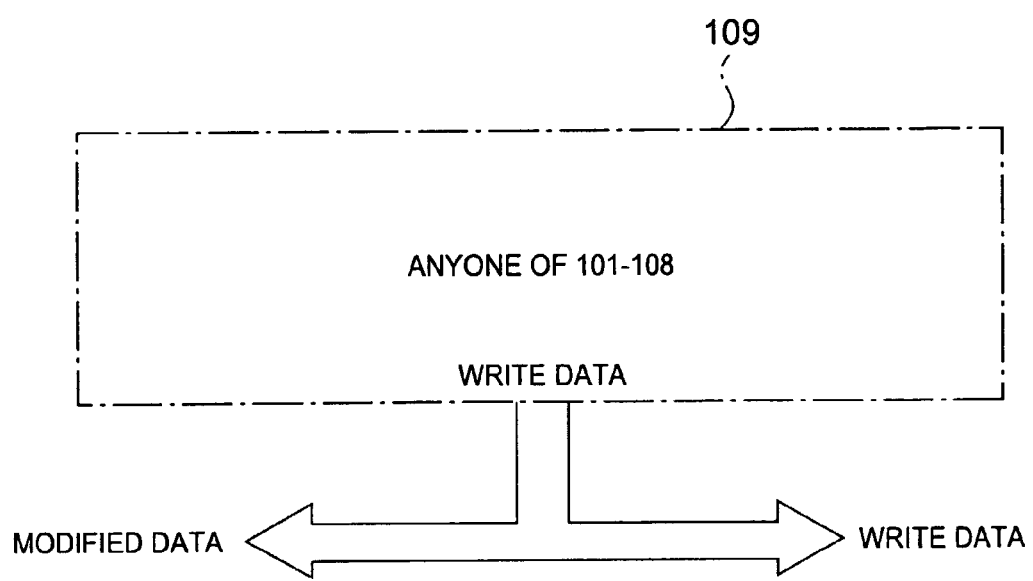
FIG. 21 is a system block diagram incorporating a read-modify-write unit according to the seventeenth embodiment of the present invention.
Figure 22:
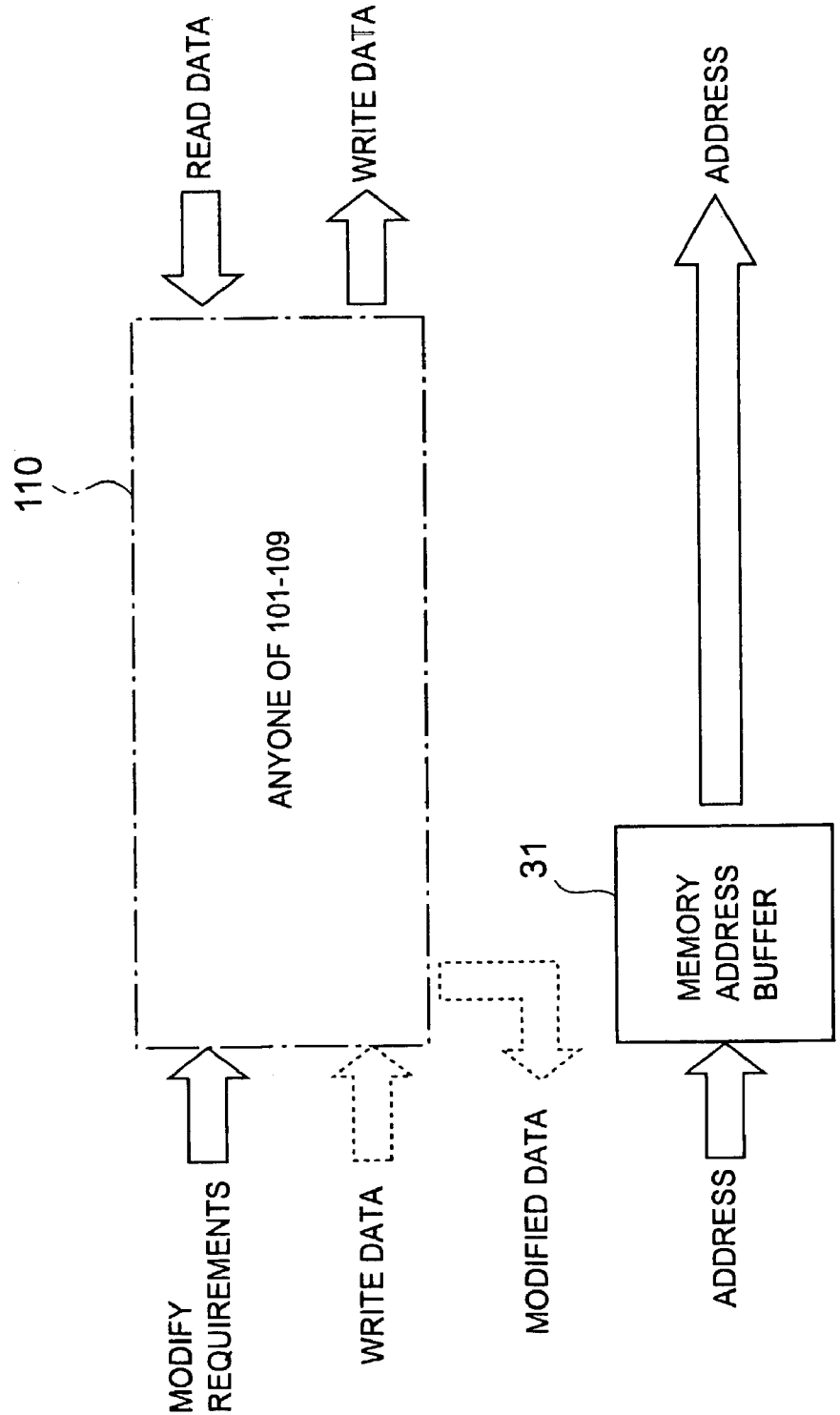
FIG. 22 is a system block diagram incorporating a read-modify-write unit according to the eighteenth embodiment of the present invention.
Figure 23:
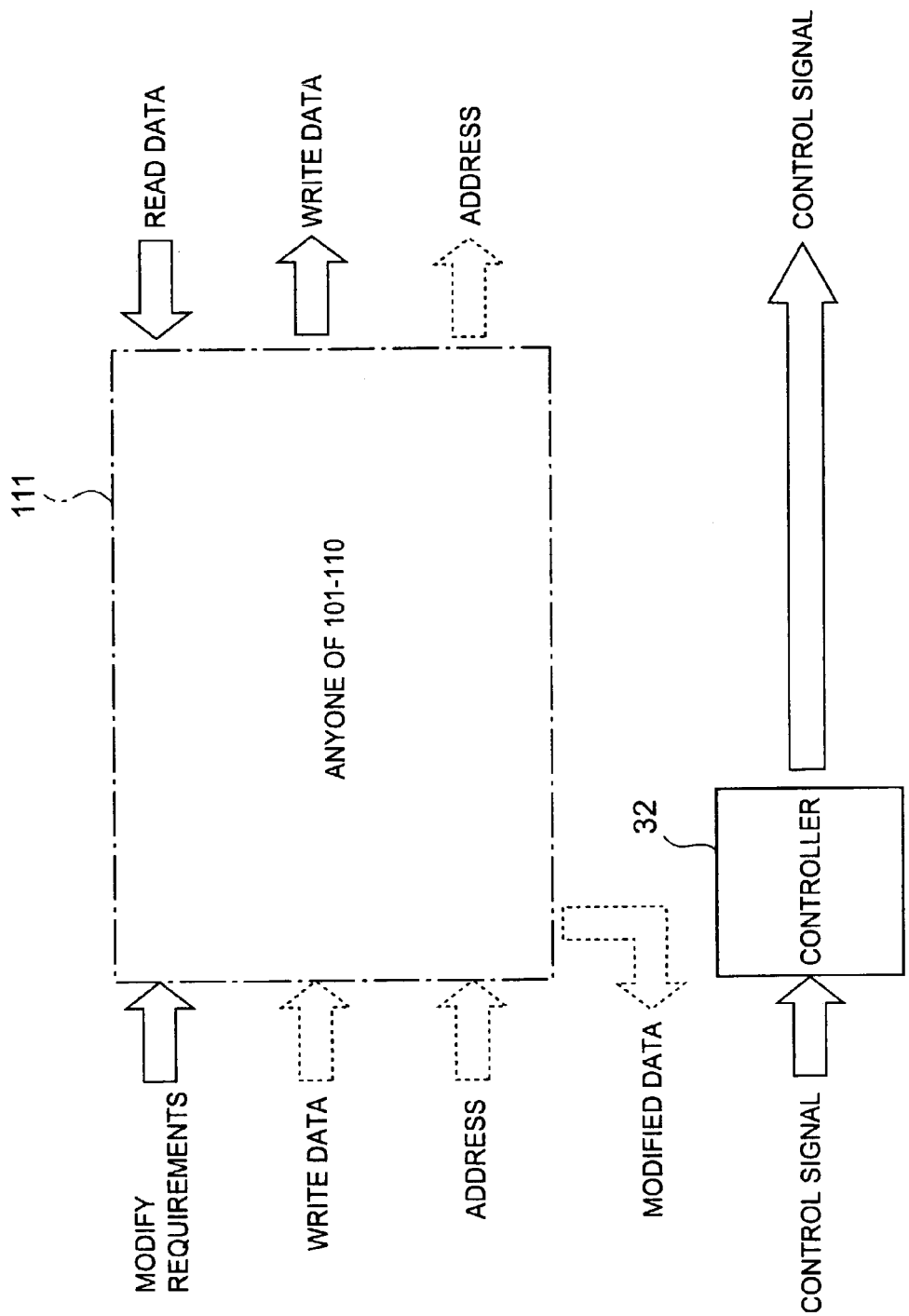
FIG. 23 is a system block diagram incorporating a read-modify-write unit according to the nineteenth embodiment of the present invention.
Figure 24:
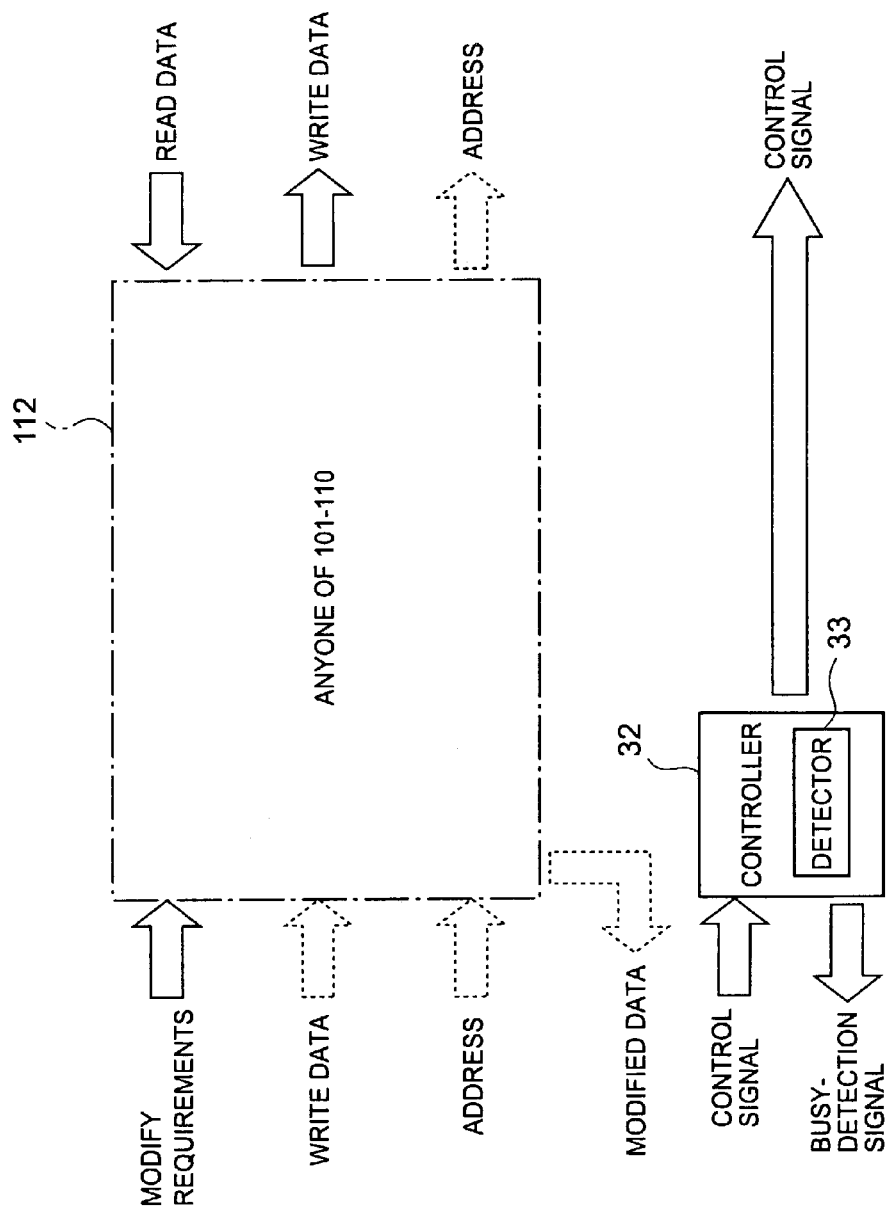
FIG. 24 is a system block diagram incorporating a read-modify-write unit according to the twentieth embodiment of the present invention.
Figure 25:
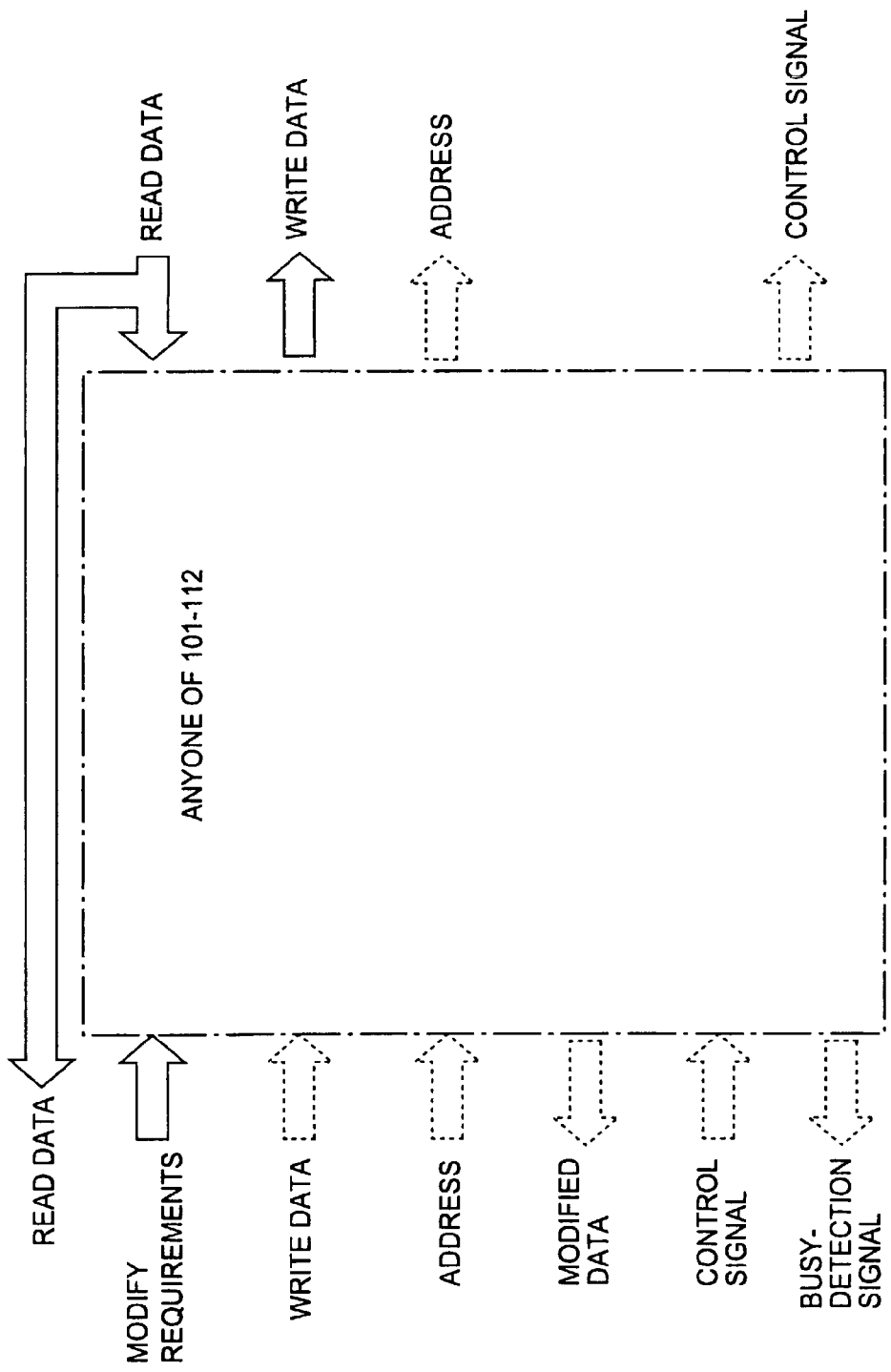
FIG. 25 is a system block diagram incorporating a read-modify-write unit according to the twenty-first embodiment of the present invention.
Figure 29:
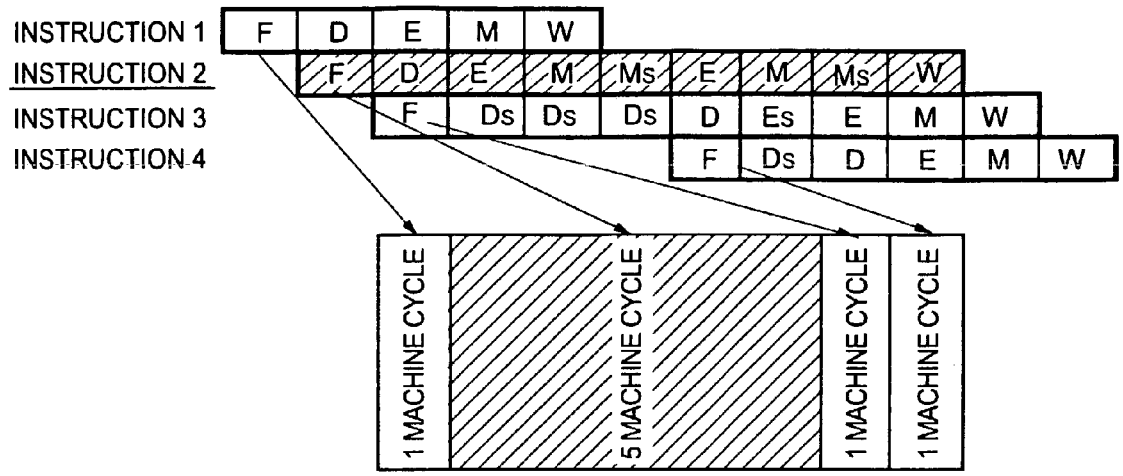
FIG. 29 is an illustration showing a fourth known RMW processing in the case of read/write processing to a memory having a slow access time, in a RISC processor with pipeline instruction execution.

(8) As shown in FIGS. 11 and 20, a system according to the sixteenth embodiment of the present invention, based on the system (1), (2) or (3), may have a data selector 16 for selecting either the write data from the CPU 1 or the modify data from the modify-requirements buffer 12 and outputting the selected data to the modify operation circuit 15.

(9) As shown in FIGS. 11 to 21, a system according to the seventeenth embodiment of the present invention, based on any one of the systems (1) to (8), may have an function of outputting the modified data from the modify operation circuit 15 to the CPU 1.

(10) As shown in FIGS. 11 to 22, a system according to the eighteenth embodiment of the present invention, based on any one of the systems (1) to (9), may have a memory address buffer 31 for storing the memory addresses from the CPU 1 and outputting them to the BIU 3.

(11) As shown in FIGS. 11 to 23, a system according to the nineteenth embodiment of the present invention, based on any one of the systems (1) to (10), may have a controller 32 for receiving the read request, the write request or the read-modify-write request from the CPU 1 and, on receiving the read-modify-write request, outputting a control signal carrying a read, a write or a dummy bus cycle to the BIU 3. The controller 32 controls a series of processing from a read bus cycle to a write bus cycle without an interruption during a read-modify-write request.

(12) As shown in FIGS. 11 to 24, a system according to the twentieth embodiment of the present invention, based the system (11), the controller 32 may have a detector 33 for detecting a busy state in which the controller 32 cannot accept any one of new read, write and read-modify-write requests from the CPU 1 and outputting a detected result (a busy detection signal) to the CPU 1.

(13) As shown in FIGS. 11 to 25, a system according to the twenty-first embodiment of the present invention, based on any one of the systems (1) to (12), may have a function of outputting the read data from the BIU 3 to the CPU 1.

As disclosed in detail, the present invention provides processors with the built-in read-modify-write units to execute CPU instructions following the read-modify-write processing but in parallel with this processing.

Therefore, the present invention achieves high throughput and shortened apparent execution time for read-modify-write instructions.

Especially, based on the basic idea in the present invention, it is possible to execute each read-modify-write instruction in one machine cycle like other instructions.

What is claimed is:

1. A data processing system comprising:
    a central processing unit to decode and execute given instructions;
    a memory to store given data;
    a bus interface unit, provided between the central processing unit and the memory, to start a read bus cycle to read data from the memory, a write bus cycle to write data to the memory, or a dummy bus cycle different from the read and write bus cycles; and
    a read-modify-write unit provided between the central processing unit and the bus interface unit, the read-modify-write unit including:
    a modify-requirements buffer to store modify requirements composed of modify data output from the central processing unit and an operation control signal; and
    a modify operation circuit to apply an operation processing to read data output from the bus interface unit with the modify data output from the modify-requirements buffer under the operation control signal to output an operation result to the bus interface unit, as write data.

2. The data processing system according to claim 1, wherein the read-modify-write unit further includes a memory read-data buffer to store the read data output from the bus interface unit, the modify operation circuit applying the operation processing to the read data output from the memory read-data buffer with the modify data from the modify-requirements buffer.

3. The data processing system according to claim 2, wherein the central processing unit outputs modify requirements obtained by encoding the modify data and the operation control signal, the read-modify-write unit further including a modify-requirements decoder, provided between the modify-requirements buffer for storing the output modify requirements and the modify operation circuit, to decode the output modify requirements into modify data and an operation control signal.

4. The data processing system according to claim 2, wherein the read-modify-write unit further includes:
    a memory write-data buffer to store write data supplied by the central processing unit; and
    a selector to select either the write data output from the memory write-data buffer or modified data that is the operation result output from the modify operation circuit and output the selected data to the bus interface unit.

5. The data processing system according to claim 4, wherein the modified data output from the modify operation circuit of the read-modify-write unit is output to the central processing unit.

6. The data processing system according to claim 2, wherein the read-modify-write unit further includes:
    a data selector to select either write data supplied by the central processing unit or read data read from the memory via the bus interface unit; and
    a data buffer to store data output from the data selector and supply the stored data to the modify operation circuit.

7. The data processing system according to claim 2, wherein the read-modify-write unit further includes a data selector to select either write data supplied by the central processing unit or modify data output from the modify-requirements buffer and output the selected data to the modify operation circuit.

8. The data processing system according to claim 2, wherein the read-modify-write unit further includes a memory address buffer to store a memory address output from the central processing unit and output the stored memory address to the bus interface unit.

9. The data processing system according to claim 2, wherein the read-modify-write unit further includes a controller to receive a read request, a write request or a read-modify-write request output from the central processing unit and output a control signal for requesting the read bus cycle, the write bus cycle or the dummy bus cycle to the bus interface unit, in response to the read-modify-write request, to avoid interruption in a series of processing from read to write.

10. The data processing system according to claim 9, wherein the controller has a detector to detect a busy state in which the controller cannot accept any one of new read, write and read-modify-write requests from the central processing unit and output a busy detection signal carrying a detected result.

11. The data processing system according to claim 10, wherein the read data output from the bus interface unit is output to the central processing unit.

12. The data processing system according to claim 1, wherein the modify operation circuit applies the operation processing between the read data read from the memory via the bus interface unit and the modify data output from the modify-requirements buffer under the operation control signal also output from the modify-requirements buffer, the read-modify-write unit further including a memory write-data buffer to store write data that is the operation result output from the modify operation circuit and output the write data to the bus interface unit.

13. The data processing system according to claim 12, wherein the central processing unit outputs modify requirements obtained by encoding the modify data and the operation control signal, the read-modify-write unit further including a modify-requirements decoder, provided between the modify-requirements buffer for storing the output modify requirements and the modify operation circuit, the modify-requirements decoder decoding the output modify requirement into modify data and an operation control signal.

14. The data processing system according to claim 13, wherein the read-modify-write unit further includes:
a memory write-data buffer to store write data supplied by the central processing unit; and
a selector to select either the write data output from the memory write-data buffer or modified data that is the operation result output from the modify operation circuit, the selected data being output to the bus interface unit as write data.

15. The data processing system according to claim 14, wherein the modified data output from the modify operation circuit of the read-modify-write unit is output to the central processing unit.

16. The data processing system according to claim 13, wherein the read-modify-write unit further includes:
a data selector to select either write data supplied by the central processing unit or read data read from the memory via the bus interface unit; and
a data buffer to store data output from the data selector and supply the stored data to the modify operation circuit.

17. The data processing system according to claim 12, wherein the read-modify-write unit further includes a data selector to select either write data supplied by the central processing unit or modified data output from the modify operation circuit and output the selected data to the memory write-data buffer.

18. The data processing system according to claim 12, wherein the read-modify-write unit further includes a data selector to select either write data supplied by the central processing unit or read data read from the memory via the bus interface unit and output the selected data to the modify operation circuit.

19. The data processing system according to claim 12, wherein the read-modify-write unit further includes a data selector to select either write data supplied by the central processing unit or modify data output from the modify-requirements buffer and output the selected data to the modify operation circuit.

20. The data processing system according to claim 12, wherein the read-modify-write unit further includes a memory address buffer to store a memory address output from the central processing unit and output the stored memory address to the bus interface unit.

21. The data processing system according to claim 12, wherein the read-modify-write unit further includes a controller to receive a read request, a write request or a read-modify-write request output from the central processing unit and output a control signal for requesting the read bus cycle, the write bus cycle or the dummy bus cycle to the bus interface unit, in response to the read-modify-write request, to avoid interruption in a series of processing from read to write.

22. The data processing system according to claim 21, wherein the controller has a detector to detect a busy state in which the controller cannot accept any one of new read, write and read-modify-write requests from the central processing unit and output a busy detection signal carrying a detected result.

23. The data processing system according to claim 22, wherein the read data output from the bus interface unit is output to the central processing unit.

24. The data processing system according to claim 1, wherein the read-modify-write unit further includes:
a memory read-data buffer to store read data output from the bus interface unit; and
a memory write-data buffer to store write data that is the operation result output from the modify operation circuit and output the stored data to the bus interface unit,
wherein the modify operation circuit performs the operation processing between the read data output from the memory read-data buffer and the modify data output from a modify requirements buffer under the operation control signal.

* * * * *